(12) United States Patent
Shiokawa et al.

(10) Patent No.: US 7,307,410 B2
(45) Date of Patent: Dec. 11, 2007

(54) ALTERNATING CURRENT DETECTION COIL

(75) Inventors: Akimi Shiokawa, Osaka (JP); Eiji Iwami, Osaka (JP); Yasuo Ichimura, Osaka (JP); Akihiro Ishibashi, Osaka (JP); Kazunari Yoshimura, Osaka (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 11/562,005

(22) Filed: Nov. 21, 2006

(65) Prior Publication Data

US 2007/0152651 A1 Jul. 5, 2007

(30) Foreign Application Priority Data

Dec. 2, 2005 (JP) .............................. 2005-348941

(51) Int. Cl.
*G01R 19/00* (2006.01)
*H01F 27/28* (2006.01)

(52) U.S. Cl. ..................................... 324/76.11; 336/229

(58) Field of Classification Search ............. 324/76.11, 324/117 R, 127; 336/123, 173, 174, 200, 336/223, 225, 229, 232
See application file for complete search history.

(56) References Cited

U.S. PATENT DOCUMENTS 5,414,400 A * 5/1995 Gris et al. .................. 336/174

6,313,623 B1 * 11/2001 Kojovic et al. ............. 324/127
6,822,547 B2 * 11/2004 Saito et al. ................. 336/200
6,909,279 B2    6/2005 Niwa
7,106,162 B2 * 9/2006 Saito .......................... 336/229

FOREIGN PATENT DOCUMENTS

JP          6-176947        6/1994
JP          2004-087619     3/2004

OTHER PUBLICATIONS

English language Abstract of JP 6-176947.
English language Abstract of JP 2004-087619.

* cited by examiner

*Primary Examiner*—Vincent Q. Nguyen
*Assistant Examiner*—Hoai-An D. Nguyen
(74) *Attorney, Agent, or Firm*—Greenblum & Bernstein, P.L.C.

(57) ABSTRACT

The AC detection coil is a toroidal coil and includes plural radial-line conductors which are formed on a front face and a rear face of a substrate, conductive connection parts and conductive through-holes which connect electrically each end of radial-line conductors, wherein plural winding turns are consecutively formed by a connection of each radial-line conductor on the front and the rear faces, respectively, and include a forward coil and a backward coil, and each shape on the front and the rear faces of the radial-line conductors and the conductive connection parts are identical with each other. Consequently, when seen from a thickness direction of the substrate, areas of the forward coil and the backward coil are equal to each other, and an external, unneeded to be detected, magnetic field can be canceled each other by the forward coil and the backward coil, then a current detection accuracy can be improved.

10 Claims, 22 Drawing Sheets

FIG.3
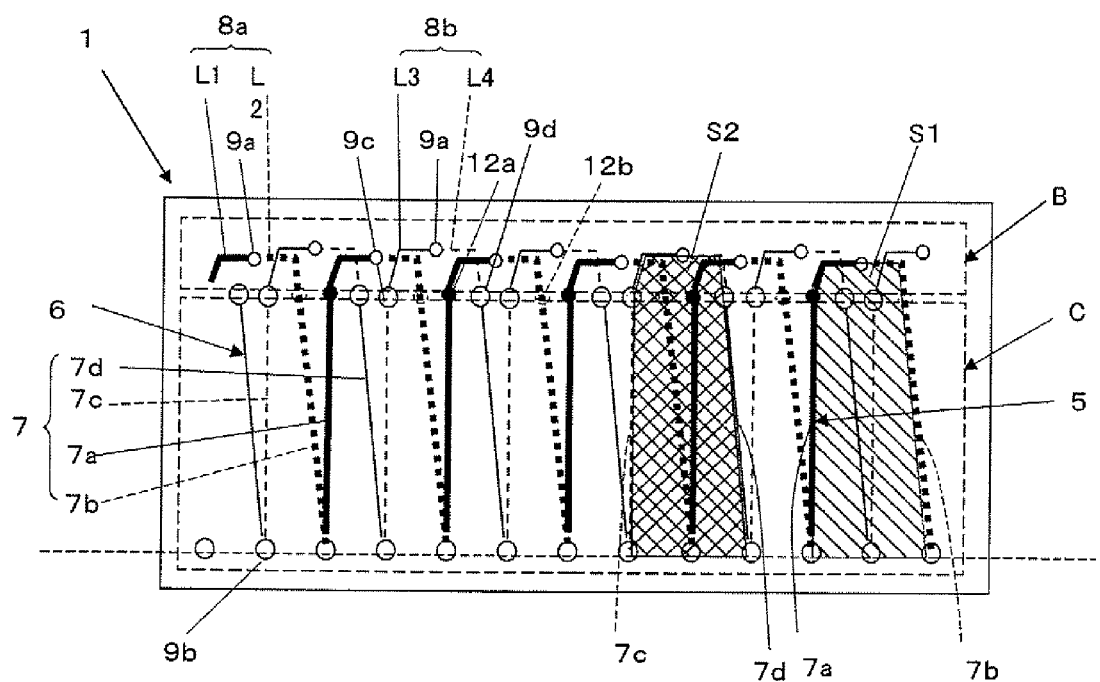
— FORWARD COIL (FRONT FACE)
······· FORWARD COIL (REAR FACE)
— BACKWARD COIL (FRONT FACE)
------ BACKWARD COIL (REAR FACE)
 REGION S1 PER ONE COIL IN PATTERN OF FORWARD COIL
 REGION S2 PER ONE COIL IN PATTERN OF BACKWARD COIL FIG.4
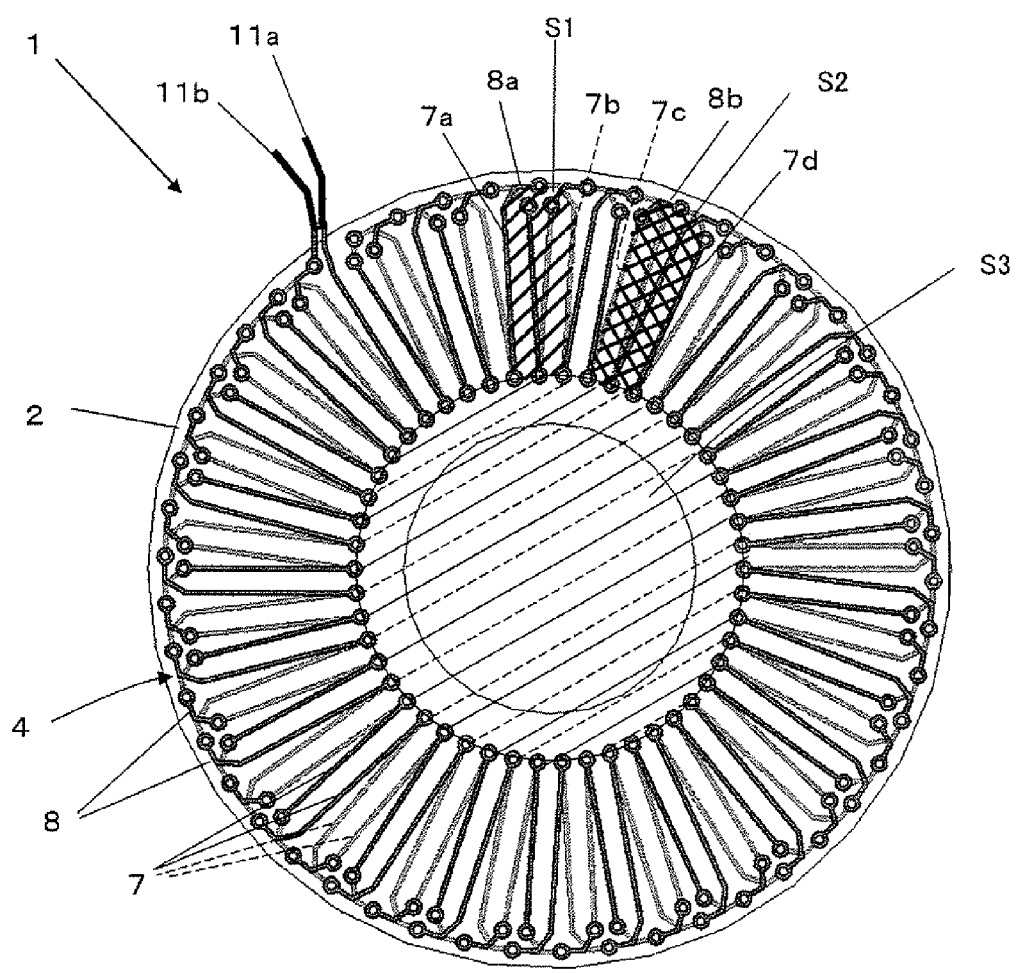
 REGION S1 PER ONE COIL IN PATTERN OF FORWARD COIL
 REGION S2 PER ONE COIL IN PATTERN OF BACKWARD COIL
 REGION S3 COMMON TO BOTH FORWARD COIL AND BACKWARD COIL — FORWARD COIL (FRONT FACE)
▪▪▪▪▪▪▪ FORWARD COIL (REAR FACE)
——— BACKWARD COIL (FRONT FACE)
- - - - - BACKWARD COIL (REAR FACE)

▨ REGION S6 PER ONE COIL IN PATTERN OF FORWARD COIL

▩ REGION S7 PER ONE COIL IN PATTERN OF BACKWARD COIL

▨ REGION S3 COMMON TO BOTH FORWARD COIL AND BACKWARD COIL

FIG.16
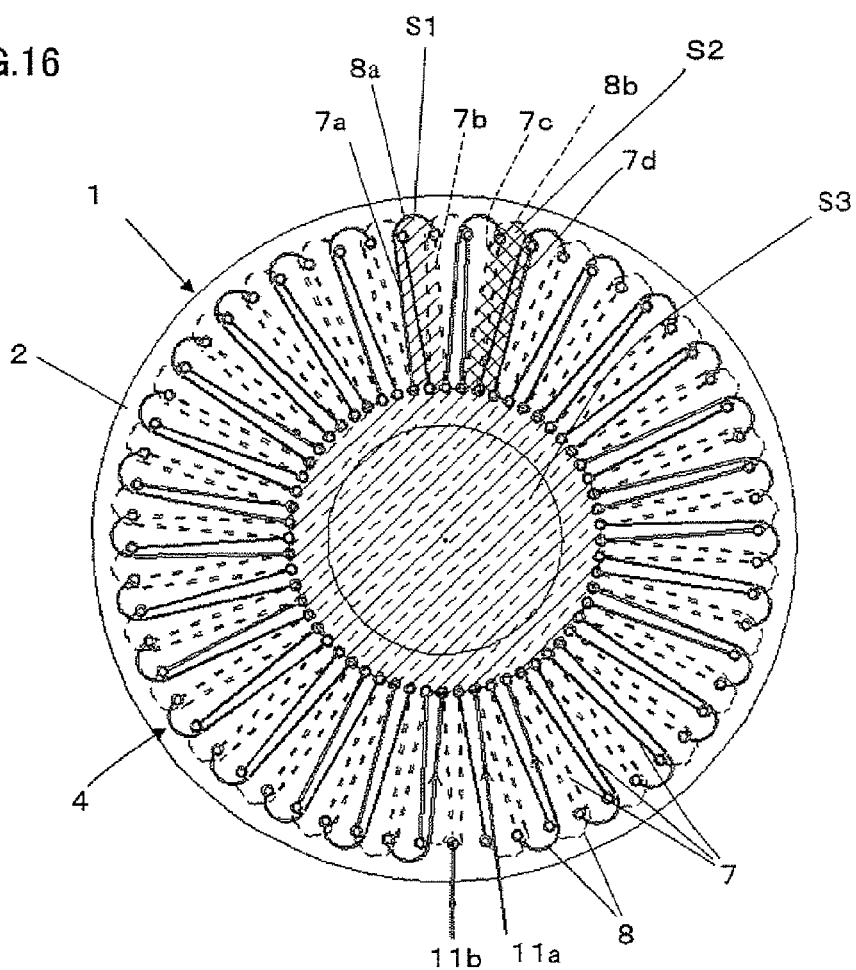
 REGION S1 PER ONE COIL IN PATTERN OF FORWARD COIL
 REGION S2 PER ONE COIL IN PATTERN OF FORWARD COIL
 REGION S3 COMMON TO BOTH FORWARD COIL AND BACKWARD COIL

ALTERNATING CURRENT DETECTION COIL

BACKGROUND OF THE INVENTION

1. Field of the Invention

The present invention relates to an alternating current detection coil which is formed on an insulating substrate to carry out a non-contact detection of a current passing through a branch circuit in a household power distribution board and so on.

2. Description of the Related Art

A conventional air-core sensor coil used for an alternating current detection is shown in FIGS. 27 and 28 (refer to Japanese Laid-Open Patent Publication No. HEI 06-176947). In these diagrams, a sensor coil 100 comprises a double-sided multilayer board 102 (referred to as a print board hereinafter) having a circular opening 101, and a coil 103 disposed around the opening 101. The print board 102 is made of an epoxy resin including glass. The coil 103 has a conductor which is printed radially, centering around the opening 101, and the coil is formed by connecting these conductors in series through conductive connection parts which include through-holes, in other words, conducting layers formed on an inner surface of a penetration opening passing through in a thickness direction of the print board 102, that is, in an axial direction of the coil 103. The coil in the print board 102 is wound around in two directions at a certain pitch, and it comprises a coil 105, which is wound in a clockwise direction as indicated by an arrow 104 (referred to as a forward coil hereinafter), and a coil 107, which is wound in a counterclockwise direction as indicated by an arrow 106 (referred to as a backward coil). The forward coil 105 and the backward coil 107 are connected in series by connecting an end of the forward coil 105 and a leader of the backward coil 107, respectively.

In the forward coil 105, the conductors formed on the front face of the print board 102 are indicated in heavy full line, and the conductors formed on the rear face of the print board 102 are indicated in heavy broken line. In the backward coil 107, the conductors formed on the front face of the print board 102 are indicated in double full line, and the conductors formed on the rear face of the print board 102 are indicated in double broken line. On the front face and the rear face of the print board 102, the conductors in the forward coil 105 and in the backward coil 107 are alternately disposed at a certain pitch, respectively. In the forward coil 105, the conductors having different length are alternately disposed on the front face and the rear face at a certain pitch, and also in the backward coil 107, in the same manner, the conductors having different length are alternately disposed on the front face and the rear face at a certain pitch. The respective pitches of the conductors in the forward coil 105 are connected to each other on an outer side far from the opening 101, and the respective pitches of the conductors in the backward coil 107 are connected to each other on an inner side close to the opening 101. Consequently, when seeing the forward coil 105 and the backward coil 107 from a direction perpendicular to the thickness direction of the print board 102, areas of regions surrounded by the respective conductors differ according to their coil pitches. Moreover, when seeing the forward coil 105 and the backward coil 107 from the thickness direction of the print board 102 (the axial direction), area of regions surrounded by the respective conductors differ, also.

In the sensor coil 100 having such a feature, a conductor (an electrical wire) being detected is let into the opening 101, and then an induced current, which is generated by passing a magnetic flux, caused by a current passing through the conductor being detected, through a cross-section region surrounded by the conductors in the forward coil 105 and the backward coil 107, is detected. To increase the detection sensitivity, it is necessary to increase an induced electromotive force from a detecting magnetic field contributing to a detection in the forward coil 105 and the backward coil 107, and it is preferable to generate the induced electromotive force uniformly by equalizing the areas surrounded by the conductors in the forward coil 105 and the backward coil 107 in case of cutting along a surface perpendicular to the print board 102.

However, the cross-section areas surrounded by the forward coil 105 and the backward coil 107 differ according to their coil pitches, thus sensitivity of the detecting is deteriorated. Specifically, a difference of the cross-section areas surrounded by the forward coil 105 and the backward coil 107 affects in detecting an external magnetic field as the sensor coil gets closer to an electric wire, which does not need to be detected. More specifically, when the electrical wire which does not need to be detected is close to the forward coil 105 and the backward coil 107, a magnetic flux having an oblique component relatively increases compared to a case that it is positioned away. Consequently the difference in detecting the external magnetic field occurs according to the difference of the cross-section areas surrounded by the forward coil 105 and the backward coil 107, and a canceling effect against the unnecessary magnetic field is thus weakened.

Moreover, when seeing the forward coil 105 and the backward coil 107 from the thickness direction of the print board 102, a magnetic flux in the magnetic field generated from an electrical wire which is not the conductor being detected (referred to as the external magnetic field) sometimes passes through a front surface surrounded by the conductors in the forward coil 105 and the backward coil 107, other than a magnetic flux, which is to be detected, in a magnetic field generated from the conductor being detected (referred to as the detecting magnetic field). The external magnetic field is unnecessary for the original current detection, and the detected current from the external magnetic field causes a detection error. To control the detection error, the unnecessary detected current from the external magnetic field should be cancelled by equalizing the respective front surface surrounded by the forward coil 105 and the backward coil 107, each of which winds in a direction opposite to each other.

However, in the sensor coil 100 described above, the front surface area surrounded by the forward coil 105 is larger than the front surface area surrounded by the backward coil 107. Consequently, the forward coil 105 and the backward coil 107 cannot cancel out the induced current generated from the external magnetic field completely, and it is difficult to control the detection error.

There is also a sensor coil similar to the sensor coil described above, and when seeing it from an axial direction, a forward coil is formed in a sawtooth pattern, and a backward coil is formed in a triangular pattern, so that a pitch of each coil is uniformed (refer to Japanese Laid-Open Patent Publication No. 2004-87619). However, even in this sensor coil, in the same manner as the sensor coil described above, a negative effect from the external magnetic field cannot be cancelled sufficiently for the reason that the respective areas surrounded by the forward coil and the backward coil still differ.

SUMMARY OF THE INVENTION

The present invention is to solve the problem of the conventional arts described above, and an object of the present invention is to provide an alternating current detection coil improving a detection accuracy by canceling out an external magnetic field, which does not need to be detected.

The present invention provides an alternating current detection coil for carrying out a non-contact detection of an alternating current, wherein the alternating current detection coil, which is a toroidal coil, comprises plural radial-line conductors which are formed on a front face and a rear face of an insulating substrate so as to radiate out from a periphery of an opening provided on the insulating substrate, conductive connection parts and conductive first through-holes which extend in a circumferential direction to connect electrically each end of radial-line conductors on the front face and the rear face respectively on either one of an outer side or an inner side of the radial-line conductors, and conductive second through-holes which connect electrically each end of radial-line conductors on the front face and the rear face respectively on other one of the outer side and the inner side of the radial-line conductors, wherein plural winding turns are consecutively formed by a connection of each radial-line conductor on the front face and the rear face respectively through the conductive connection parts and the first and the second through-holes, the plural winding turns comprise a forward coil which winds in one direction and a backward coil which winds in a reverse direction with returning consecutively from an end of the forward coil, each winding turn of the forward coil and the backward coil is disposed alternately on both the front face and the rear face, each conductive connection part is routed to avoid a contact with a next radial-line conductor on both the front face and the rear face, and each shape of the radial-line conductors in the forward coil and the backward coil and the conductive connection parts on the front face and the rear face are identical with each other.

According to the present invention, when seen from a thickness direction of the insulating substrate, areas surrounded by the forward coil and the backward coil are equal to each other, so that an induced electromotive current generated from an external magnetic field, which does not need to be detected, from an electrical wire, disposed adjacent to the coil, can be canceled, and consequently, a detection error in detecting the alternating current can be reduced.

It is preferable that each connection part has a pattern to connect each end of the radial-line conductor on the front face and the rear face through the first through-hole and that the pattern on the front face has a length approximately equal to the pattern on the rear face with the through-hole between.

According to this composition, respective amounts of the external magnetic fields respectively passing from a front face direction and a cross-section direction in the forward coil and the backward coil are approximately equal to each other, so that a canceling accuracy with regard to the external magnetic field between the forward coil and the backward coil is improved, and a current detection error can be reduced.

According to the feature of a preferred embodiment in the present invention, more radial-line conductors can be disposed, thus a density of coil can be increased, and the detection accuracy can be improved. Moreover, the similar effect can be obtained by disposing more connection parts.

According to the feature of the preferred embodiment in the present invention, a negative effect from the magnetic field passing through the forward coil and the backward coil can be uniformed more in comparison with the conventional arts, and the canceling effect against the external magnetic field is improved.

According to the feature of the preferred embodiment in the present invention, both the forward coil and the backward coil are axisymmetrical with respect to a central axis of the toroidal coil by equalizing each coil angle between the two radial-line conductors which form the respective turns in the forward coil and the backward coil, thus an effect to cancel out an induced electromotive force generated from each turn in the forward coil and the backward coil with regard to the external magnetic field is improved.

According to the feature of the preferred embodiment in the present invention, a small-size coil can correct a non-uniformity in lengths of the coils, thus the forward coil and the backward coil can be uniformed with regard to the external magnetic field, and the external magnetic field can be canceled.

According to the feature of the preferred embodiment in the present invention, the respective front surface areas surrounded by the forward coil and the backward coil when seeing the insulating substrate planarly are identical with each other, thus the negative effect from the external magnetic field can be canceled with high accuracy.

According to the feature of the preferred embodiment in the present invention, the induced electromotive force generated from both the forward coil and the backward coil can be reduced by reducing the areas of the forward coil and the backward coil when seen from respective front surface directions of the forward coil and the backward coil, thus the canceling accuracy with regard to each induced electromotive force generated from the forward coil and the backward coil is improved.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein:

FIG. 3 is a pattern diagram of respective conductive connection parts and radial-line conductors in a forward coil and a backward coil, with magnifying a part B and a part C in FIG. 1;

FIG. 4 is a diagram showing areas formed by the forward coil and the backward coil in the alternating current detection coil in the first preferred embodiment;

FIG. 16 is a diagram showing areas formed by a forward coil and a backward coil in the alternating current detection coil in the sixth preferred embodiment;

DESCRIPTION OF THE PREFERRED EMBODIMENTS

Figure 1:
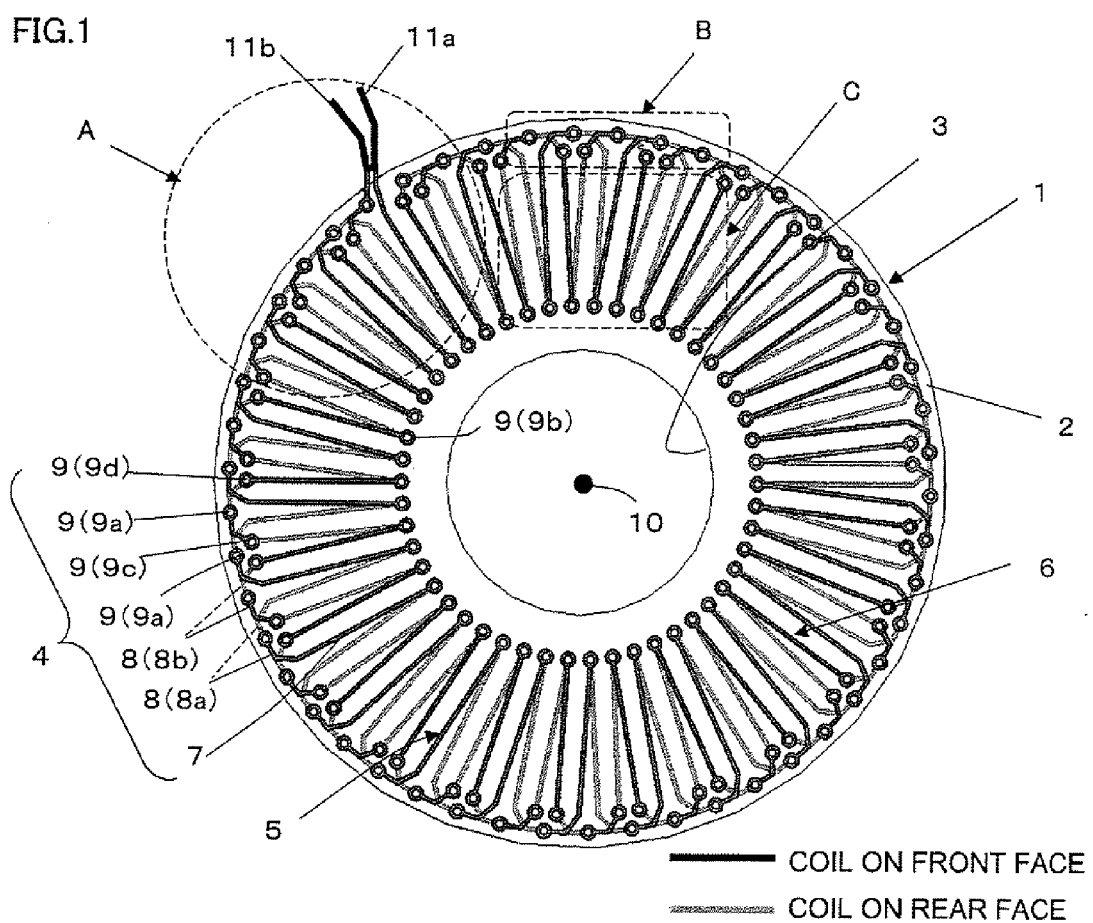
FIG. 1 is a plane view of an alternating current detection coil according to a first preferred embodiment of the present invention.
Figure 2:
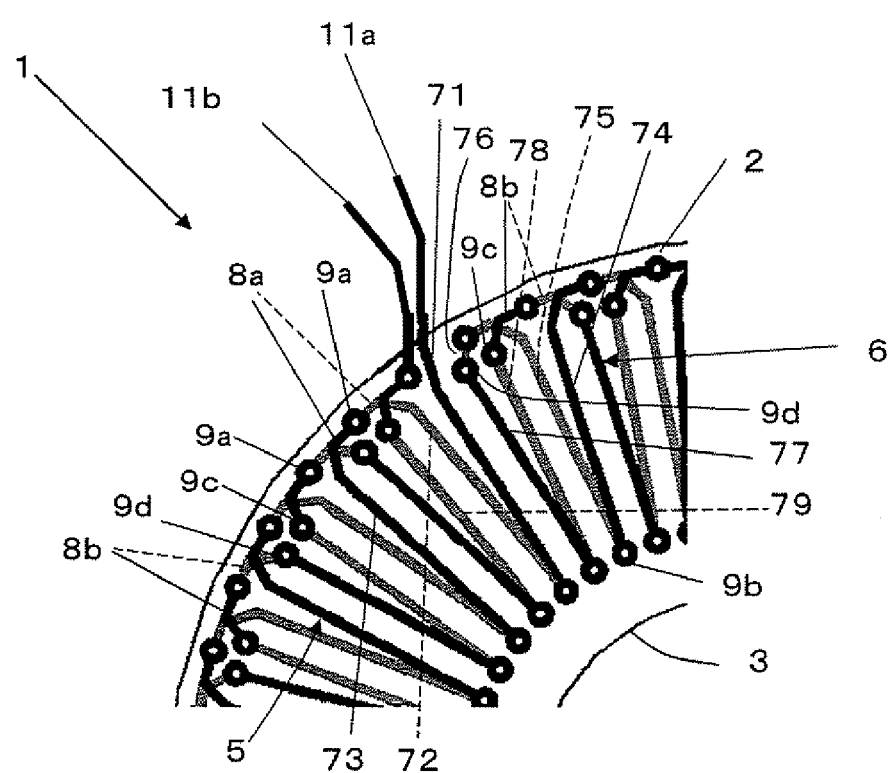
FIG. 2 is a magnified view of a part A in FIG. 1.

The alternating current detection coil according to the first preferred embodiment of the present invention is described below with reference to FIGS. 1 to 6D. In FIGS. 1 and 2, an alternating current detection coil 1 (referred to as a detection coil, hereinafter) of the first preferred embodiment comprises a plate-shaped insulating substrate 2 (referred to as a substrate, hereinafter) which is to be a nonmagnetic core of the coil and a toroidal coil 4 formed on the substrate 2. An opening 3 having approximately a circular shape is formed in a center of the substrate 2. The toroidal coil 4 has a forward coil 5 which winds in one direction (a counterclockwise direction) and a backward coil 6 which winds in a reverse direction (a clockwise direction) with returning consecutively from an end of the forward coil 5, and both the forward coil 5 and the backward coil 6 are formed doubly on one substrate 2 and connected consecutively to each other in series.

The forward coil 5 and the backward coil 6 are composed of plural radial-line conductors 7 which are formed on the front face and the rear face of the substrate 2 radially from the opening 3, connection parts 8 (8a and 8b) which extend in a circumferential direction at a regular pitch to connect electrically the plural radial-line conductors 7 both on the front face and on the rear face, and through-holes 9 which connect electrically each radial-line conductor 7 on the front face and the rear face consecutively. The through-holes 9 include first through-holes 9a, 9c, and 9d on an outer side (a side far from the opening 3) and a second through-hole 9b in an inner side (a side close to the opening 3). The through-holes 9a, 9b, 9c and 9d are disposed equally in number on circumferences at regular intervals, respectively.

In the present preferred embodiment, on the outer side of each radial-line conductor 7 on the front face and the rear face, each end of the radial-line conductor 7 on the front face and the rear face in the forward coil 5 is connected to each other through each connection part 8a and each first through-hole 9a, both of which are continuous with each radial-line conductor 7 on the front face and the rear face. On the inner side of each radial-line conductor 7, each end of the radial-line conductor 7 is connected to each other through each second through-hole 9b. In this manner, a consecutive winding turn is formed by connecting each radial-line conductor 7 on the front face and the rear face, and the forward coil 5 is formed by disposing the plural winding turns consecutively.

On the outer side of each radial-line conductor 7 on the front face and the rear face, each end of the radial-line conductor 7 on the rear face in the backward coil 6 is connected to each connection part 8b on the front face through each first through-hole 9c, and each connection part 8b on the front face is connected to each connection part 8b on the rear face through each first through-hole 9a, and then each connection part 8b on the rear face is connected to each end of the radial-line conductor 7 on the front face. On the inner side of each radial-line conductor 7, each end of the radial-line conductor 7 is connected to each other through each second through-hole 9b. In the same manner as the above description, a consecutive winding turn is formed, and the backward coil 6 is formed by disposing the plural winding turns consecutively. Each winding turn of the forward coil 5 and the backward coil 6 is disposed alternately on both the front face and the rear face. Moreover, each pitch per one turn of the forward coil 5 and the backward coil 6 is formed equally to each other. The forward coil 5 and the backward coil 6 are formed to have an identical coil pattern with each other on the two faces of the substrate 2. In FIGS. 1 and 2, the radial-line conductors 7 and the connection parts 8 on the front face of the substrate 2 are indicated in dark fill line, and the radial-line conductors 7 and the connection parts 8 on the rear face are indicated in light full line. The shape of the substrate 2 is not limited to a circular shape, however any shape, such as a rectangular shape and so on, is applicable to the substrate 2 to meet various purposes. The respective compositions of the forward coil 5 and the backward coil 6 described above can be replaced with each other.

Each connection part 8 (8a and 8b) is routed to avoid a contact with the next radial-line conductor 7 on both the front face and the rear face. Each through-hole 9a is provided on a middle position of each connection part 8a and each connection part 8b on the front face and the rear face. Each coil in the forward coil 5 and the backward coil 6 is connected to each other through each through-hole 9a on the front face and the rear face, and the coil on the front face has a length approximately equal to the coil on the rear face with the through-hole 9a between.

In the through-holes 9, the through-holes 9c and 9d are disposed to be axisymmetrical with respect to a straight line connecting the through-holes 9a and 9b. With regard to the through-holes 9a on an outermost side (on a circumference with a radius of R1) and the through-holes 9c and 9d (on a circumference with a radius of R2), it is preferable that a difference between the radius R1 and R2 is minimized so that a negative effect from an external magnetic field is suppressed, and in particular, the difference between the radius R1 and R2 should be one millimeter (1 mm) or less.

Each radial-line conductor 7 is formed to be approximately symmetrical with respect to a center 10 in the opening 3, and to be uniform at a certain pitch, on the substrate 2. The conductors comprising the radial-line conductors 7 and the connection parts 8 are made of a copper foil and formed on the substrate 2. The copper foil can be formed by an etching of a double-sided print board made of an epoxy resin including glass, for example.

On occasion of the current detection, a conductor being detected is let into the opening 3, and then the detection coil 1 detects an induced current generated by passing a magnetic flux of the magnetic field (detecting magnetic field), caused by a current passing through the conductor being detected, through a cross-section region of the forward coil 5 and the backward coil 6.

Next, details of the connection between the forward coil 5 and the backward coil 6 is described with reference to FIG. 2. The forward coil 5 starts with a first radial-line conductor 71, which is connected to a coil lead terminal 11a, then it is connected to a next radial-line conductor 73 through the through-hole 9b on the inner side, a radial-line conductor 72 on the rear face, a connection part 8a on the rear face, the through hole 9a on the outer side, and the connection part 8a on the front face, and then the forward coil 5 winds almost around the substrate 2 in a counterclockwise direction in the same manner as the above description, and subsequently, ends with a radial-line conductor 75 on the rear face through a last radial-line conductor 74 and the through-hole 9b on the inner side. Then, the backward coil 6 starts through a return line 76 (a connection point) which is continuous with the radial-line conductor 75.

The backward coil 6 starts with a first radial-line conductor 77 on the front face through the through-hole 9d, which is connected to the return line 76, then it is connected to a radial-line conductor 78 on the rear face through the through hole 9b, and moreover, connected to the connection part 8b on the front face through the through-hole 9c, and furthermore, connected to the connection part 8b on the rear face through the through-hole 9a. Subsequently, the backward coil 6 winds almost around the substrate 2 in a clockwise direction in the same manner as the above description, and ends with a last radial-line conductor 79, and then connected to a coil lead terminal 11b.

In this manner, each pitch per one turn of the forward coil 5 and the backward coil 6 is formed equally to each other, and the forward coil 5 and the backward coil 6 wind in a forward direction and a backward direction, respectively, so that an induced electromotive force is led electrically in the same direction. Subsequently, the forward coil 5 and the backward coil 6 detect induced currents in the same direction, with regard to a magnetic flux which passes through cross-sections of the forward coil 5 and the backward coil 6, and they detect induced currents in opposite directions, with regard to the external magnetic field from a direction perpendicular to the substrate 2. In particular, as for the detection coil 1, in the whole toroidal coil 4, the detection current with regard to the detecting magnetic field from the conductor being detected is to be a sum of the respective induced currents generated in the forward coil 5 and the backward coil 6, so that the induce currents which are proportionate to a number of turns can be obtained, and with regard to the external magnetic field which does not need to be detected, a difference between the induced currents detected by the forward coil 5 and the backward coil 6 is detected, and then the induced currents are canceled. The respective detection currents from the forward coil 5 and the backward coil 6 are output from the coil lead terminals 11a and 11b.

Next, each connection part 8a and 8b in the forward coil 5 and the backward coil 6 are described with reference to FIG. 3. Patterns of the forward coil 5 and the backward coil 6 on the front face are indicated in heavy full line and thin full line, and patterns on the rear face are indicated in broken lines corresponding to the full lines on the front face.

The forward coil 5 is composed of a radial-line conductor 7a on the front face, a radial-line conductor 7b on the rear face, the connection part 8a, and the through-hole 9a per one turn. The connection part 8a has a connection line L1 on the front face and a connection line L2 on the rear face, and the connection lines L1 and L2 having an identical length with each other are connected to ends 12a and 12b of the radial-line conductors 7a and 7b, respectively, and the connection lines L1 and L2 are connected by the through-hole 9a. Thus, the connection part 8a has an identical pattern on both the front face and the rear face.

Similarly, the backward coil 6 is composed of a radial-line conductor 7c on the rear face, a radial-line conductor 7d on the front face, the connection part 8b, and the through-holes 9a, 9c, and 9d per one turn. The connection part 8b has a connection line L3 on the front face and a connection line L4 on the rear face, and the connection lines L3 and L4 having an identical length with each other are connected to the through-holes 9c and 9d, to which ends of the radial-line conductors 7c and 7d are connected, respectively, and the connection lines L3 and L4 are connected with each other by the through-hole 9a. According to this composition, the connection part 8a has an identical pattern on both the front face and the rear face. Thus, as shown in FIG. 3, areas of regions S1 and S2, seen from a front face of the forward coil 5 and the backward coil 6, are approximately equal to each other Next, it is described that a negative effect from the external magnetic field, which enters from the front face of the coil, is reduced by the forward coil 5 and the backward coil 6 with reference to FIG. 4. Regions surrounded by each one coil pattern of the forward coil 5 and the backward coil 6 when seeing the substrate 2 from the axial direction are indicated by the regions S1 and S2. The region S1 is shown as a shaded area which is surrounded by the radial-line conductors 7a and 7b on the front side and the rear face and the connection part 8a in the forward coil 5. The region S2 is shown as a cross-hatching area which is surrounded by the radial-line conductors 7c and 7d on the front face and the rear face and the connection part 8b in the backward coil 6. The region S3 indicated in full line and broken line alternately is a region common to both the forward coil 5 and the backward coil 6. In the detection coil 1, the radial-line conductors 7 and the connection parts 8 are formed to have the identical shape on the front face and the rear face of the substrate 2, thus the areas of the patterns of the forward coil 5 and the backward coil 6 per one coil are approximately equal to each other.

Consequently, when each number of turns in the forward coil 5 and the backward coil 6 is 30, Area of region $S1 \times 30$ turns=Area of region $S2 \times 30$ turns Thus, the respective induced electromotive forces generated from the forward coil 5 and the backward coil 6 due to the external magnetic field are equal to each other, and the respective induced electromotive forces are led electrically in the directions opposite to each other, so that the induced electromotive forces in the detection coil 1 due to the external magnetic field are canceled. Consequently, the current detection accuracy and sensitivity are improved.

Next, it is described that a negative effect from the external magnetic field, which enters from the cross-section direction of the forward coil 5 and the backward coil 6, is reduced by the forward coil 5 and the backward coil 6 with reference to FIGS. 5A, 5B, 6A to 6D. In these diagrams, the coil patterns on the front face are indicated in full line, and the coil patterns on the rear face are indicated in broken line. FIGS. 6A to 6D show pattern diagrams of the forward coil 5 and the backward coil 6 in case of cutting along a surface perpendicular to the substrate 2.

Figure 5A:
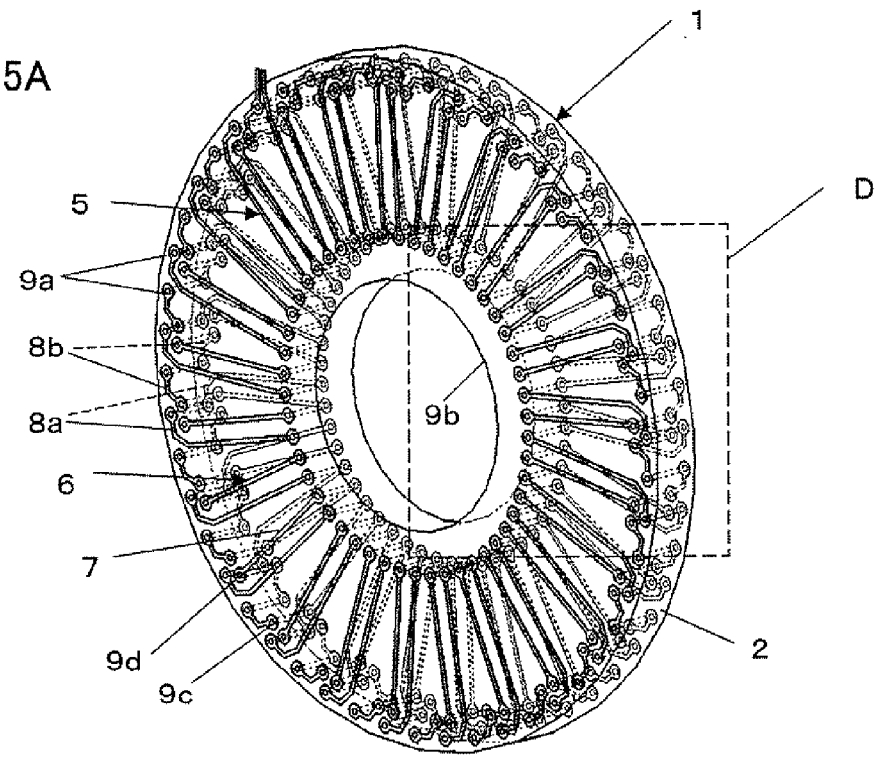
FIG. 5A is a perspective view showing the first preferred embodiment.
Figure 5B:
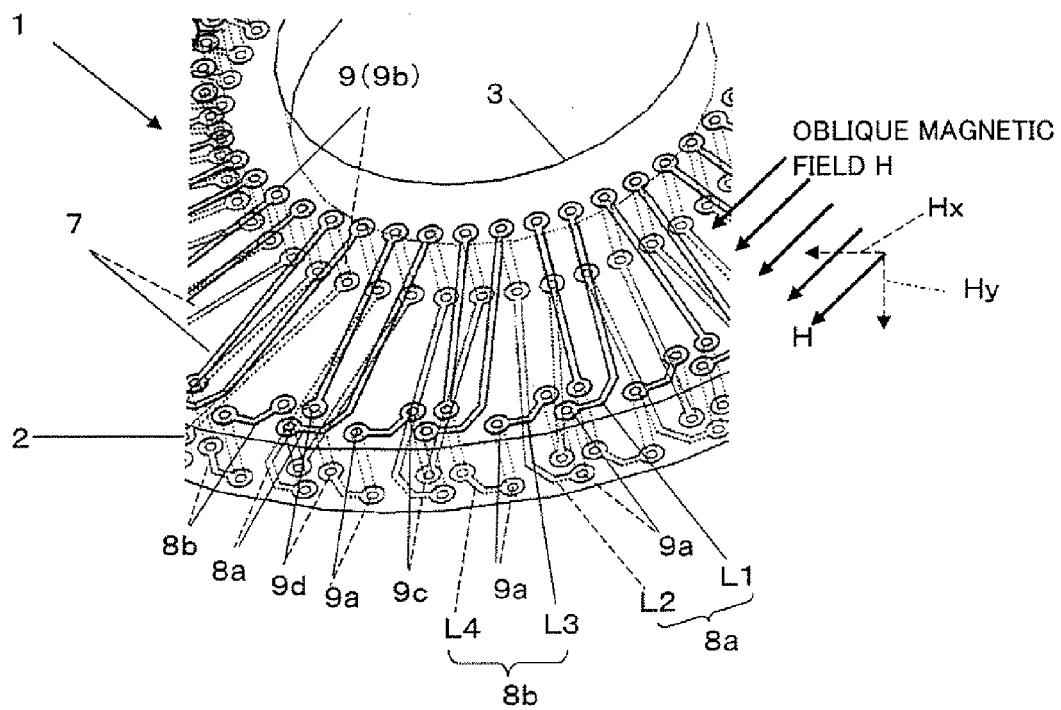
FIG. 5B is a magnified view of a part D in FIG. 5A.

As shown in FIG. 5B, with regard to the forward coil 5 and the backward coil 6, which are formed by connecting the radial-line conductors 7 and the connection parts 8 through the through-holes 9 passing though the substrate 2, it is necessary to consider not only the external magnetic field from the front face direction of the coil but also the external magnetic field entering from the cross-section direction of the coil. In case that the external magnetic field enters from a direction oblique to the front face of the coil, a magnetic field entering obliquely (referred to as H) includes a horizontal component Hx parallel to the front face of the coil in addition to a perpendicular component Hy perpendicular to the front face of the coil, thus the external magnetic field entering the respective cross-sections of the forward coil 5 and the backward coil 6 increases due to the horizontal component Hx. In the present preferred embodiment, the respective cross-section areas of the forward coil 5 and the backward coil 6 are approximately equalized with each other, thus the negative effect from the external magnetic field is suppressed in the cross-section direction, also.

Figure 6A:
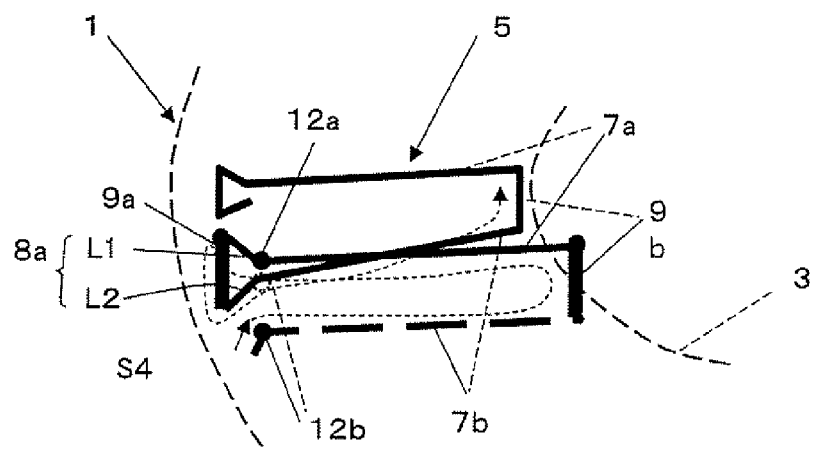
FIG. 6A is a pattern diagram of the forward coil in the first preferred embodiment.
Figure 6B:
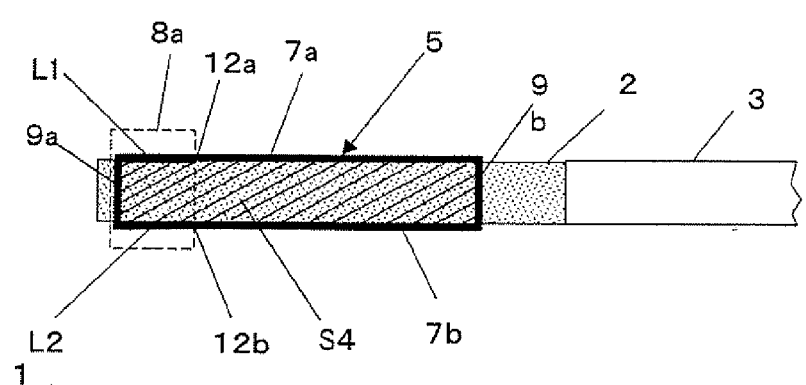
FIG. 6B is a cross-sectional view of FIG. 6A.

Cross-sectional shapes of the forward coil 5 and the backward coil 6 are described with reference to FIGS. 6A to 6D. FIGS. 6A and 6B show pattern diagrams of a composition of the forward coil 5 and a cross-section of the coil line of the forward coil 5. In FIGS. 6A and 6B, the radial-line conductor 7b on the rear face is connected to the connection line L1 in the connection part 8a through the through-hole 9b, the radial-line conductor 7a on the front face, and the end 12a. The connection line L1 is connected to the connection line L2 on the rear face in the connection part 8a through the through-hole 9a, and then connected to the radial-line conductor 7b, which is in the next coil turn, through the end 12b. Consequently, as shown by a dotted arrow in FIG. 6A, one coil in the forward coil 5 is formed, and the connection parts 8a having the same shape and length are formed on the front face and the rear face.

Figure 6C:
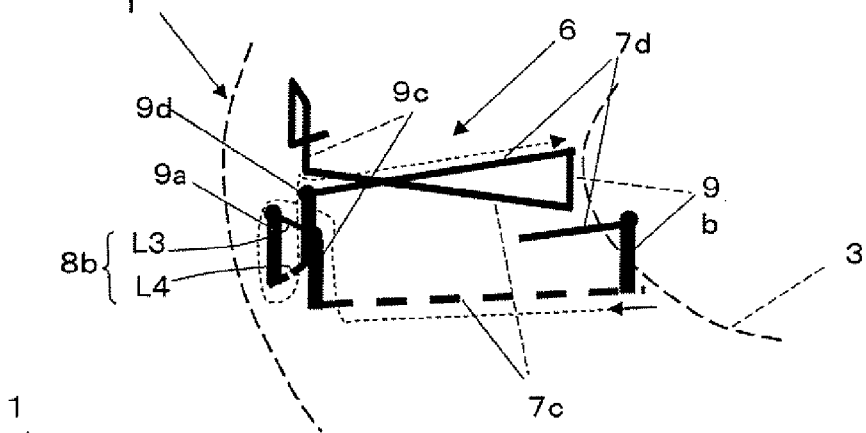
FIG. 6C is a pattern diagram of the backward coil in the first preferred embodiment.
Figure 6D:
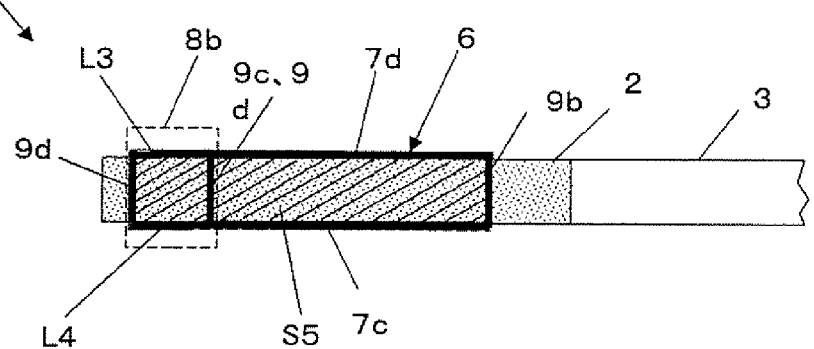
FIG. 6D is a cross-sectional view of FIG. 6C.

Similarly, in FIGS. 6C and 6D, the radial-line conductor 7c on the rear face is connected to the connection line L3 in the connection part 8b in the front face through the through-hole 9c. Then, the connection line L3 is connected to the connection line L4 on the rear face in the connection part 8b through the through-hole 9a, and then connected to the radial-line conductor 7d, which is in the next coil turn, on the front face through the through-hole 9d. Consequently, as shown by a dotted arrow in FIG. 6C, one coil in the backward coil 6 is formed, and the connection parts 8b having the same shape and length are formed on the front face and the rear face.

With regard to the cross-sections of the forward coil 5 and the backward coil 6 in FIG. 6A to 6D, a cross-section area S4, which is surrounded by the radial-line conductors 7a and 7b, the connection parts 8a, and the through-holes 9a and 9b, and a cross-section area S5, which is surround by the radial-line conductors 7c and 7d, the connection parts 8b, and the through-holes 9b and 9d, are approximately equal to each other for the reason that the respective radial-line conductors 7a to 7d and the respective connection lines L1 go L4 have the same lengths in the respective coils, approximately. Consequently, the canceling effect in the cross-sections of the coil against the external magnetic field is improved by the forward coil 5 and the backward coil 6, and the negative effect from the external magnetic field is suppressed more profoundly.

As described above, according to the detection coil 1 of the present preferred embodiment, the shapes of the radial-line conductors and the connection parts are the same on the front face and the rear face of the substrate 2, the areas of the regions S1 and S2, seen from the front face direction of the forward coil 5 and the backward coil 6, are approximately equal to each other, and the cross-section areas S4 and S5, seen from the cross-section direction, are approximately equal to each other, so that the respective amounts of the external magnetic fields respectively passing from the front face direction and the cross-section direction in the forward coil and the backward coil can be approximately equal to each other. Thus, the canceling accuracy with regard to the external magnetic field between the coils is improved, and the current detection error can be reduced. In particular, the detection accuracy can be further enhanced with regard to the external magnetic field which is generated by the electrical wires disposed adjacent to the coils. In the present preferred embodiment, a print board having a coil pattern with a thickness of one millimeter (1 mm) or less enables a current measurement of several tens milliamperes (mA) or more, so that it is possible to minimize the detection coil and offer technical advantages.

Next, the alternating current detection coil according to the second preferred embodiment in the present invention is described with reference to FIG. 7. In the detection coil 1 of the present preferred embodiment, respective distances between the radial-line conductors 7a and 7d adjacent to each other in the forward coil 5 and the backward coil 6 on the front face and respective distances between the radial-line conductors 7b and 7c adjacent to each other in the forward coil 5 and the backward coil 6 on the rear face are shortened.

Figure 7:
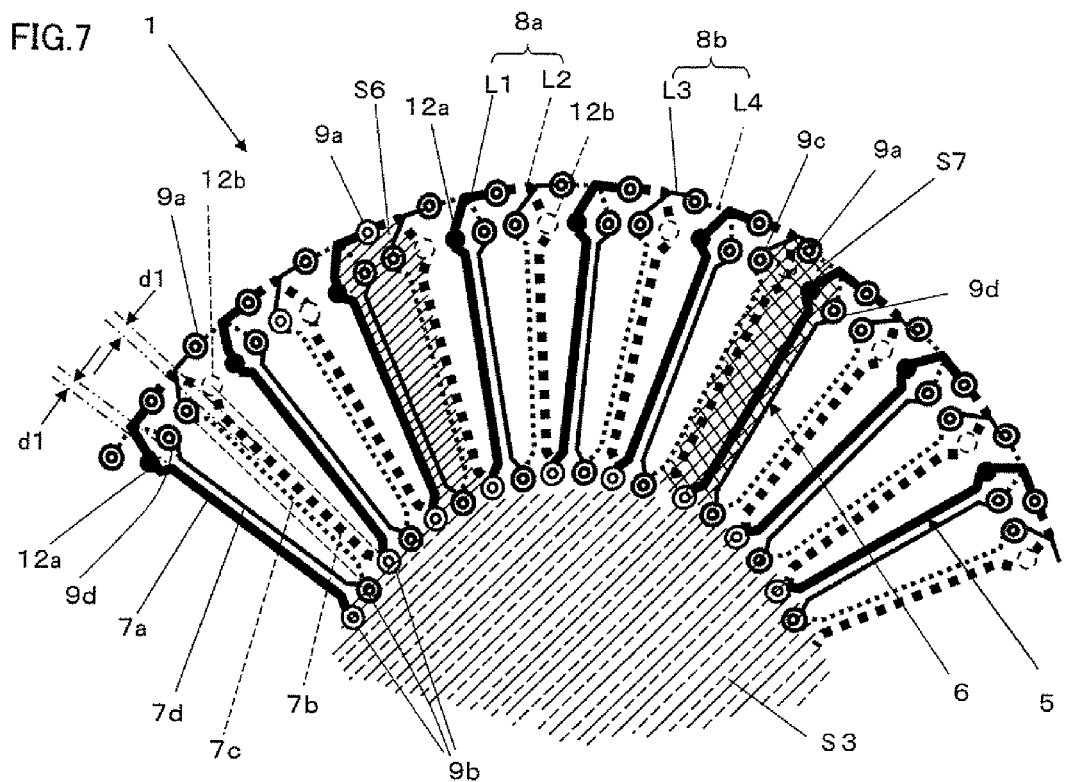
FIG. 7 is a plane view of an alternating current detection coil according to a second preferred embodiment of the present invention.

In FIG. 7, patterns of the forward coil 5 and the backward coil 6 on the front face are indicated in heavy full line and thin fill line, and patterns on the rear face are indicated in broken lines corresponding to the full lines on the front face.

The forward coil 5 is composed of the radial-line conductor 7a on the front face, the radial-line conductor 7b on the rear face, the connection part 8a, and the through-hole 9a per one turn. The connection part 8a has the connection line L1 on the front face and the connection line L2 on the rear face, and the connection lines L1 and L2 having the same length are connected to ends 12a and 12b of the radial-line conductors 7a and 7b, respectively, and the connection lines L1 and L2 are connected by the through-hole 9a. Thus, the connection part 8a has the same pattern on both the front face and the rear face.

Similarly, the backward coil 6 is composed of the radial-line conductor 7c on the rear face, the radial-line conductor 7d on the front face, the connection part 8b, and the through-holes 9a, 9c, and 9d per one turn. The connection part 8b has the connection line L3 on the front face and the connection line L4 on the rear face, and the connection lines L3 and L4 having the same length are connected to the radial-line conductors 7c and 7d and the through-holes 9c and 9d, respectively, and the connection lines L3 and L4 are connected with each other by the through-hole 9a. Thus, the connection part 8b has the same pattern on both the front face and the rear face.

Moreover, each distance d1 between the radial-line conductors adjacent to each other is shorted by making the radial-line conductor 7a get closer to the radial-line conductor 7d on the front face, and by making the radial-line conductor 7b get closer to the radial-line conductor 7c on the rear face. Thus, the radial-line conductors 7a and 7d are formed with their lines partially bended so that they get closer to each other. The same is applicable to the radial-line conductors 7b and 7c.

In this manner, as shown by the shaded area and the cross-hatching area in FIG. 7, it is possible to make the areas S6 and S7, seen from the front face of the forward coil 5 and the backward coil 6, small all together as well as having approximately the similar shape to each other on both the front face and the rear face, by narrowing the intervals between the radial-line conductors. The common region S3 is the same as described above. It is preferable to make the distance d1 between the radial-line conductors short, however, it should be approximately 0.2 mm at shortest, due to a limitation in manufacturing the print board.

As described above, according to the detection coil 1 of the present preferred embodiment, it is possible to make the areas, seen from the front face direction of the forward coil 5 and the backward coil 6, small, thus the induced electromotive force generated from the forward coil 5 and the backward coil 6 corresponding to the external magnetic field can be reduced, and the canceling accuracy with regard to each induced electromotive force generated from the forward coil 5 and the backward coil 6 is improved.

Figure 8A:
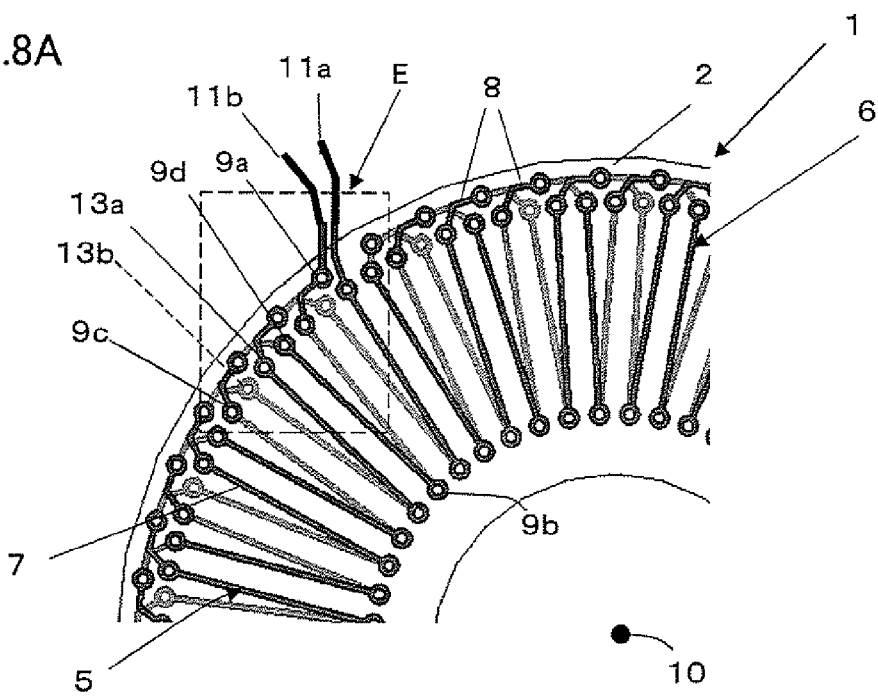
FIG. 8A is a plane view of an alternating current detection coil according to a third preferred embodiment of the present invention.
Figure 8B:
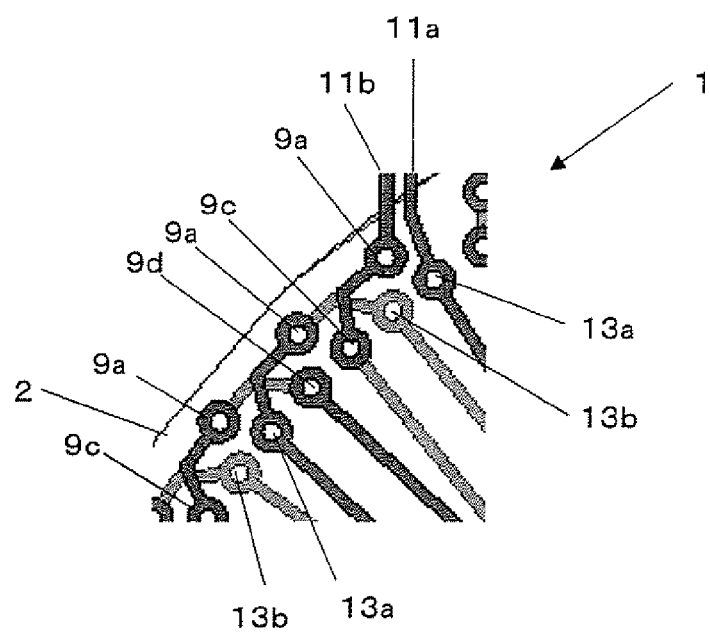
FIG. 8B is a magnified view of a part E in FIG. 8A.

Next, the alternating current detection coil according to the third preferred embodiment of the present invention is described with reference to FIGS. 8A and 8B. In the detection coil 1 of the present preferred embodiment, land patterns 13a and 13b, each of which has a size equal to a land of the through-hole, are provided in regions, where each radial-line conductor 7 in the forward coil 5 and the each conductive connection part 8 are connected, and where the through-holes are not formed.

The backward coil 6 has the through-holes 9c and 9d where each connection part 8 and each radial-line conductor 7 are connected, and land patterns are formed on the through-holes 9c and 9d. Thus, the backward coil 6 has three land patterns, that is, the land patterns of the through-holes 9c and 9d and the land pattern of the through-hole 9a.

In the forward coil 5, a connection is not necessary between the connection part 8 and the radial-line conductor 7 on the front face and the rear face, thus the respective connection parts 8 on the front face and the rear face are connected merely through the respective through-holes 9a. Consequently, the respective connection parts 8 have only one through-hole and one land pattern for the through-hole. Accordingly, in the present preferred embodiment, the forward coil 5 has the three land patterns by providing the land patterns 13a and 13b. Thus, the forward coil 5 has the same lead pattern composition as the backward coil 6. This composition enables the coil patterns of the forward coil 5 and the backward coil 6, seen from the front face of the coil, to come to have the same shape, with including the land patterns of the respective through-holes. Consequently, it is possible to equalize the negative effect on the forward coil 5 and the backward coil 6 from the external magnetic field passing through the substrate 2, and the canceling effect can further be improved.

Figure 9:
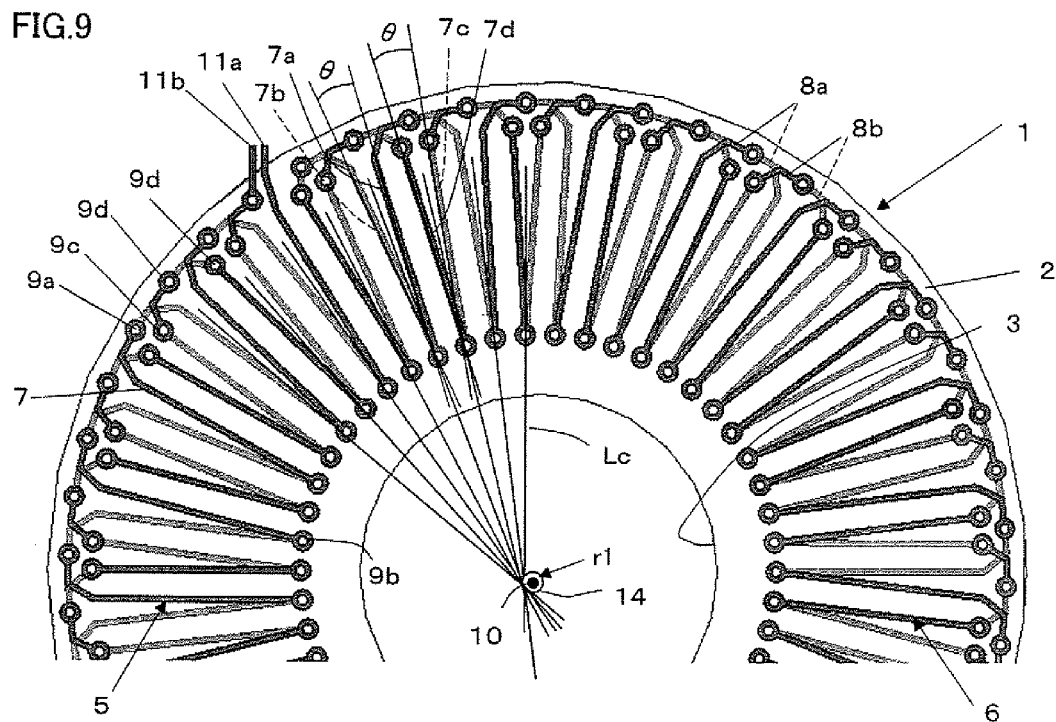
FIG. 9 is a plane view of an alternating current detection coil according to a fourth preferred embodiment of the present invention.

Next, the alternating current detection coil according to the fourth preferred embodiment of the present invention is described with reference to FIGS. 9, 10, and 11. In the detection coil 1 of the present preferred embodiment, the two radial-line conductors 7a and 7b and the two radial-line conductors 7c and 7d, which are respectively connected through the respective through-holes 9b disposed on the opening side of the substrate 2, on the front face and the rear face in the forward coil 5 and the backward coil 6 are provided so that a line segment Lc, which bisects an angle (θ) between these two radial-line conductors, tangents to a circle 14, which has a predetermined radius r1, and whose center is concentric with a toroidal coil 4, when seeing the two radial-line conductors from the front face of the toroidal coil 4.

The respective coil turns are axisymmetrical with respect to a central axis of the detection coil 1 by arranging the radial-line conductors so that the line segment Lc tangents to the circle 14 as described above, thus the effect to cancel out the induced electromotive force generated from each turn in the respective coils is improved, and accordingly, a negative effect on the detection accuracy from an external magnetic field according to a position and an angle of an electrical wire, which passes through the opening 3, can be reduced.

Figure 10:
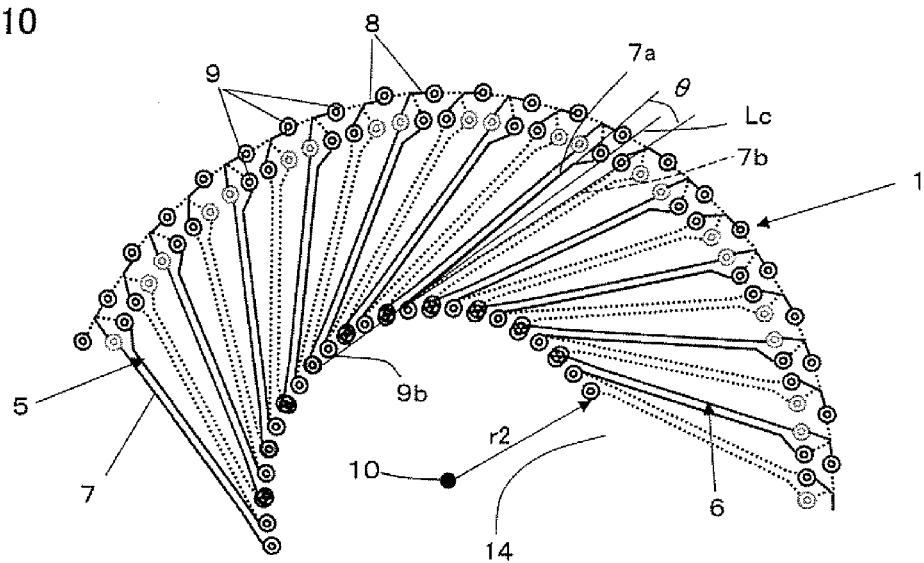
FIG. 10 is a diagram showing a modification example of the alternating current detection coil in the fourth preferred embodiment.

FIG. 10 shows the modification example of the above description. In the present modification example, the radius of the circle 14 described above is enlarged to be a radius r2, which is approximately the same size as the opening 3. In this composition, the coil pattern is still axisymmetrical with respect to the central axis of the detection coil 1, thus a possibility of a pattern design is expanded.

Figure 11:
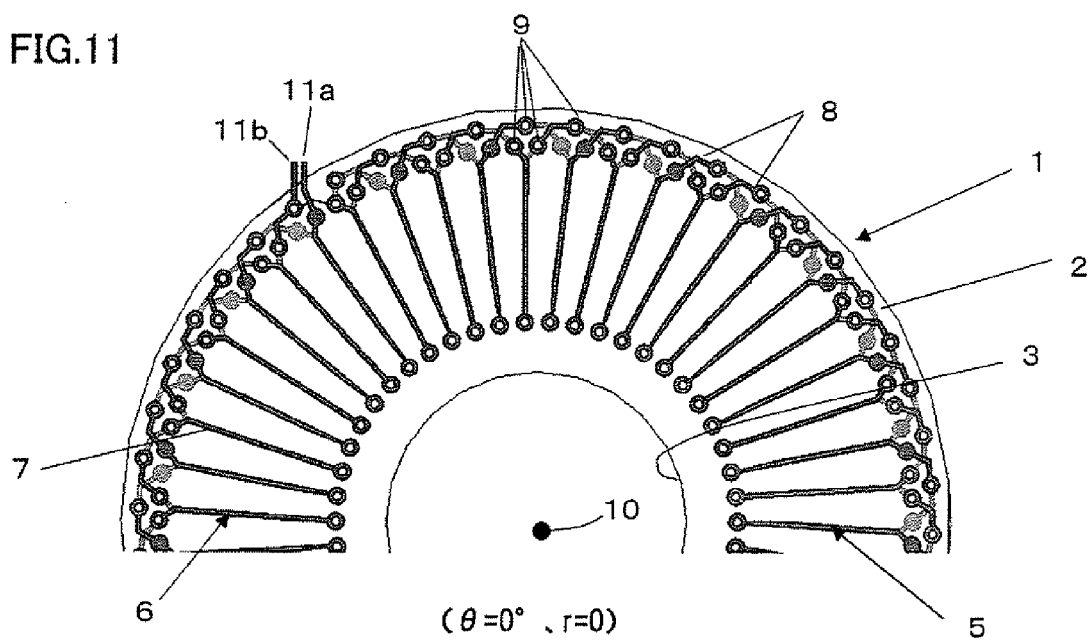
FIG. 11 is a diagram showing other modification example of other alternating current detection coil in the fourth preferred embodiment.

FIG. 11 shows the other modification example of the above description. In the present modification example, the radius r of the circle 14 described above is zero, and θ is also zero. In this composition, the radial-line conductors 7, having the through-holes 9b in common, on the front face and the rear face overlap each other, when seen from the front face of the coils.

Next, the alternating current detection coil according to the fifth preferred embodiment of the present invention is described with reference to FIGS. 12 and 13. In the detection coil 1 of the present preferred embodiment, a small-size coil 17 for correcting the external magnetic field is provided in proximity to an output part of the forward coil 5 or the backward coil 6.

Figure 12:
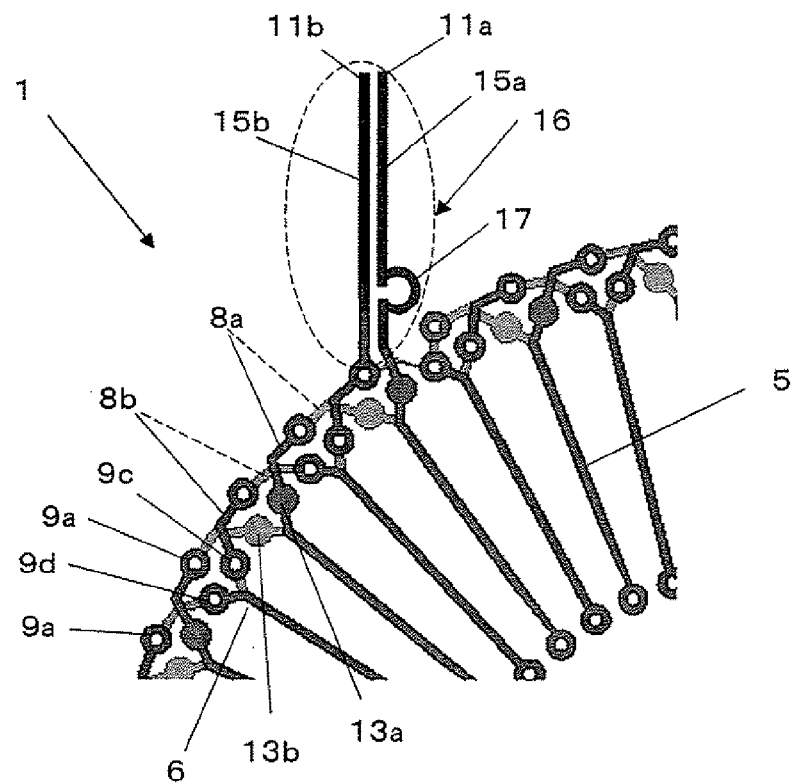
FIG. 12 is a plane view of an alternating current detection coil according to a fifth preferred embodiment of the present invention.

In FIG. 12, the detection coil 1 includes an output part 16 having a lead line 15a in the coil lead terminal 11a in the forward coil 5 and a lead line 15b in the coil lead terminal 11b in the backward coil 6, and the small-size coil 17, which has approximately one turn in shape, is disposed on a substrate surface in proximity to a part, where the lead line 15a is connected to the forward coil 5, in the lead line 15a in the output part 16. The small-size coil 17 enables an absorption of a non-uniformity in length, such as unequal coil lines, in the output part 16.

In the present preferred embodiment, the negative effect from the external magnetic field can be reduced by designing the small-size coil 17 to cancel out the negative effect from the external magnetic field in the forward coil 5 and the backward coil 6.

Figure 13:
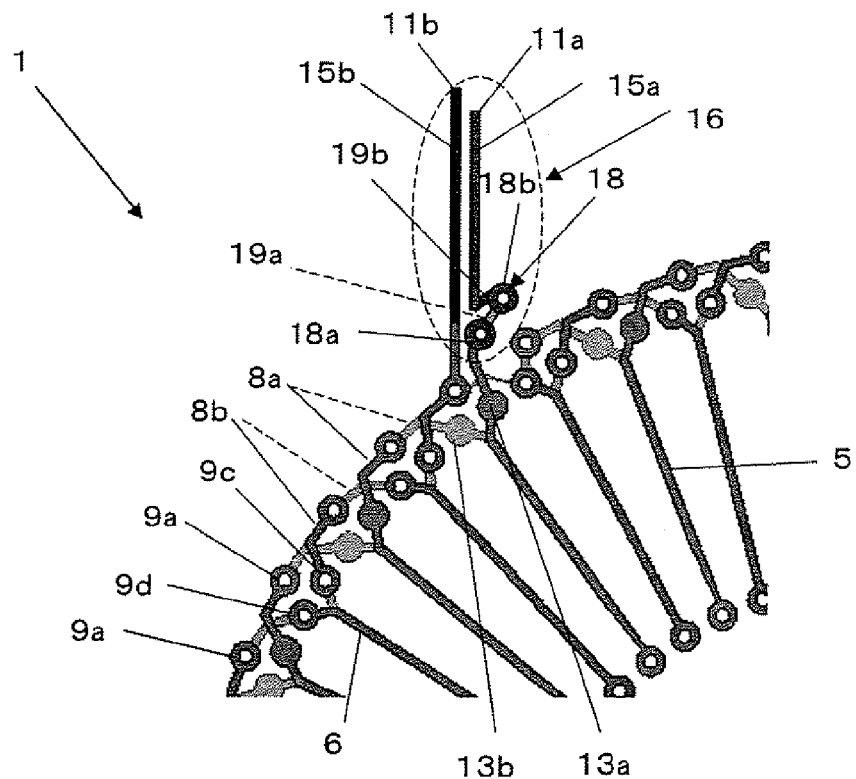
FIG. 13 is a diagram showing a modification example of the alternating current detection coil in the fifth preferred embodiment.

FIG. 13 shows a modification example of the output part 16 described above. In the output part 16, a small-size coil 18 having approximately one turn in shape is provided in the cross-section direction of the coils. The small-size coil 18 is formed to have approximately one turn in shape in the cross-section direction of the coil substrate in proximity to the part, where the lead line 15a is connected to the forward coil 5, in the lead line 15a. The small-size coil 18 is composed of a through-hole 18a, a connection line 19a on the rear face, a through-hole 18b on the connection line 19a, and a connection line 19b on the front face.

In the present modification example, the negative effect from the external magnetic field can be reduced by designing the small-size coil 18 to cancel out the negative effect from the external magnetic field, in case of a non-uniformity of the magnetic field in the cross-section direction of the coils in the output part 16 in the forward coil S and the backward coil 6. In the modification example described above, the small-size coil having approximately one turn is described, however, a small-size coil having plural turns is also applicable in case that there is a large negative effect from the external magnetic field.

Figure 14:
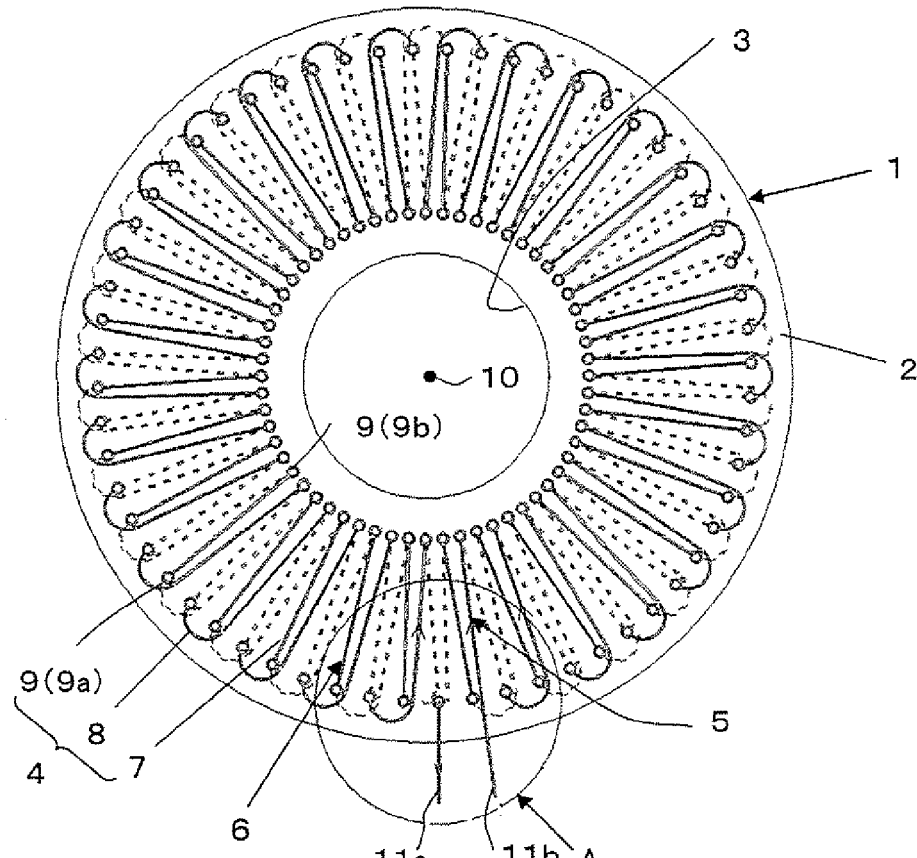
FIG. 14 is a plane view of an alternating current detection coil according to a sixth preferred embodiment of the present invention.
Figure 15:
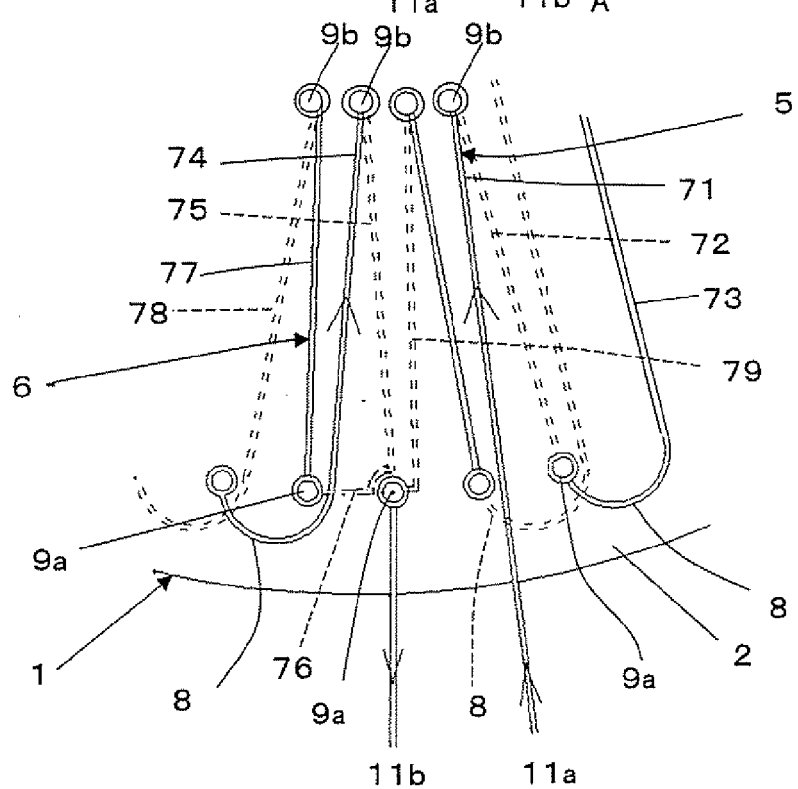
FIG. 15 is a magnified view of a part A in FIG. 14.

The alternating current detection coil according to the sixth preferred embodiment of the present invention is described with reference to FIGS. 14 to 16. The toroidal coil 4 in the detection coil 1 of the present preferred embodiment comprises the forward coil 5 and the backward coil 6 formed on the substrate 2, in the same manner as the preferred embodiments described above, and the forward coil 5 and the backward coil 6 are composed of the plural radial-line conductors 7 which are formed both on the front face and the rear face of the substrate 2 radially, the connection parts 8 which are disposed at the regular pitch to connect the plural radial-line conductors 7 both on a front face and on a rear face, and the through-holes 9 which connect electrically each radial-line conductor 7 to each connection part 8 on the front face and the rear face consecutively. In the following diagrams, the radial-line conductors 7 and the connection parts 8 on the front face are indicated in full line, and the radial-line conductors 7 and the connection parts 8 on the rear face are indicated in broken line. The through-holes 9 include the first through-holes 9a on the side far from the opening 3 and the second through-holes 9b on the side close to the opening 3, and the through-holes 9a and 9b are disposed equally in number on circumferences at regular intervals, respectively.

Details of the connection between the forward coil 5 and the backward coil 6 is described with reference to FIG. 15. The forward coil 5 starts with the first radial-line conductor 71, which is connected to the coil lead terminal 11a, then it is connected to the next radial-line conductor 73 through the through-hole 9b on the inner side, the radial-line conductor 72 on the rear face, the through hole 9a on the outer side, and the connection part 8 on the front face, and then the forward coil 5 winds almost around the substrate 2 in the counter-clockwise direction in the same manner as the above description, and subsequently, ends with the radial-line conductor 75 on the rear face through the last radial-line conductor 74 and the through-hole 9b on the inner side. Then, the backward coil 6 starts through the return line 76 (the connection point) which is continuous with the radial-line conductor 75.

The backward coil 6 starts with the first radial-line conductor 77 through the through-hole 9a, which is connected to the return line 76, on the outer side, then it is connected to the radial-line conductor 78 on the rear face through the through hole 9b. The backward coil 6 winds almost around the substrate 2 in the clockwise direction in the same manner as the above description, and ends with the last radial-line conductor 79, and then connected to the coil lead terminal 11b through the through-hole 9a.

In this manner, each pitch per one turn of the forward coil 5 and the backward coil 6 is formed equally to each other, and the forward coil 5 and the backward coil 6 wind in the forward direction and the backward direction, respectively, so that the induced electromotive force is led electrically in the same direction. Subsequently, the forward coil 5 and the backward coil 6 detect the induced currents in the same direction, with regard to the magnetic flux which passes through the cross-sections of the forward coil 5 and the backward coil 6, and they detect the induced currents in the opposite directions, with regard to the external magnetic field from the direction perpendicular to the substrate 2.

FIG. 16 shows that the negative effect from the external magnetic field is reduced by the forward coil 5 and the backward coil 6, and the description is omitted for the reason that it has similar composition to FIG. 4 described above.

Figure 17A:
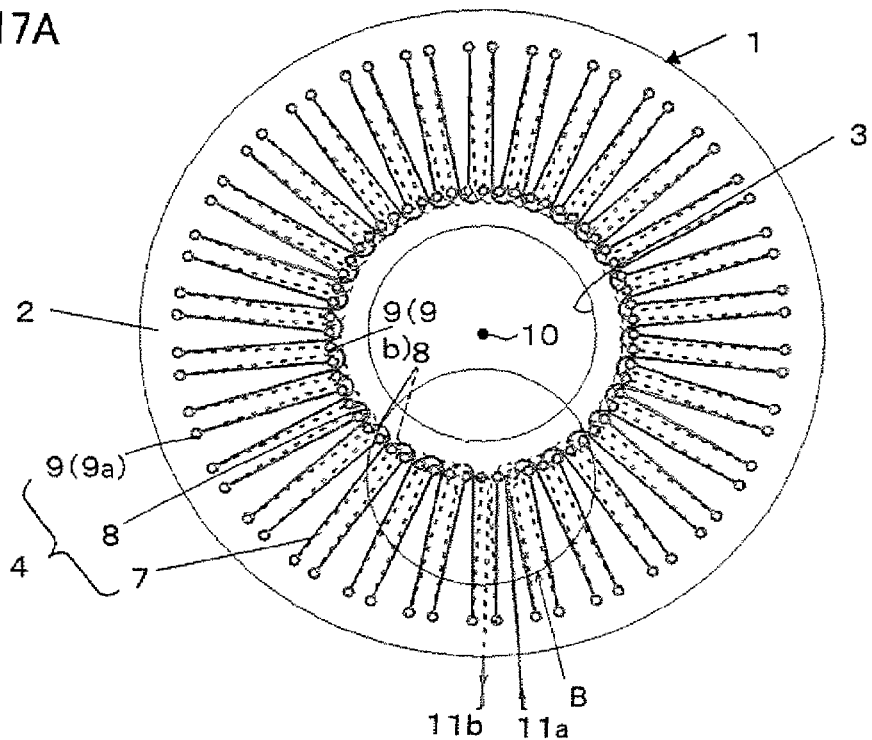
FIG. 17A is a plane view of a modification example in the sixth preferred embodiment.
Figure 17B:
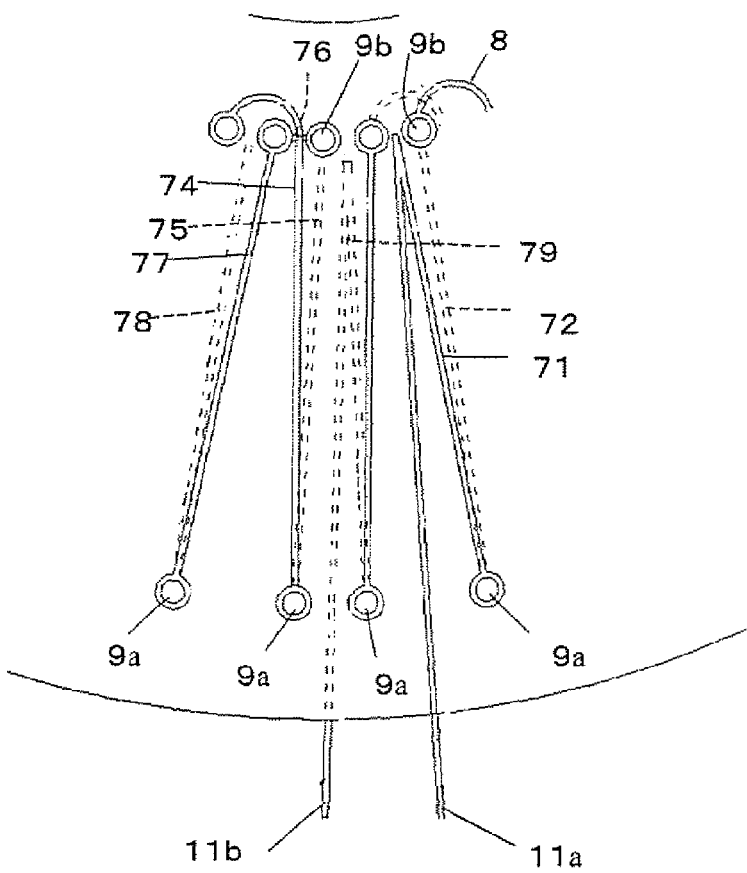
FIG. 17B is a magnified view of a part B in FIG. 17A.

Next, the modification example according to the detection coil 1 of the preferred embodiment described above is described with reference to FIGS. 17A and 17B. The detection coil 1 of the present modification example is different from the detection coil 1 described above in that the connection parts 8 are disposed on the inner side close to the opening 3 in the substrate 2, and the connection point (the return line) 76 between the forward coil 5 and the backward coil 6 is also disposed on the inner side. According to such a composition, the substrate 2 can be minimized for the reason that the connection parts 8 are disposed on the side closed to the opening 3, and thus the whole coil can be minimized, with obtaining the similar effect as the above description moreover.

Next, the other modification example is described with reference to FIGS. 18A and 18B. In the preferred embodiment described above, the through-holes connecting the coils on the front face and the rear face are disposed on one circumference consecutively, however, in the modification example shown here, the through-holes are regularly disposed on two circumferences, which are concentric circles having different radiuses.

Figure 18A:
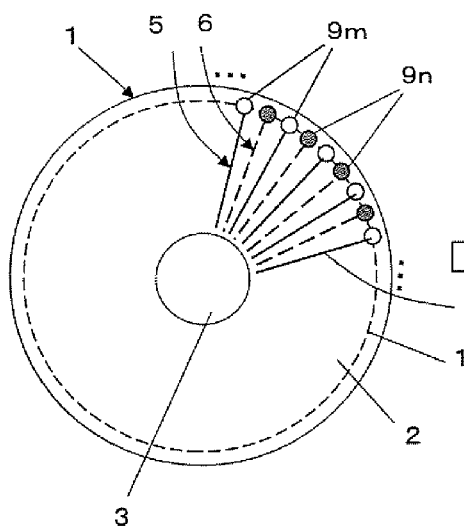
FIG. 18A is a pattern diagram showing the sixth preferred embodiment for comparison.
Figure 18B:
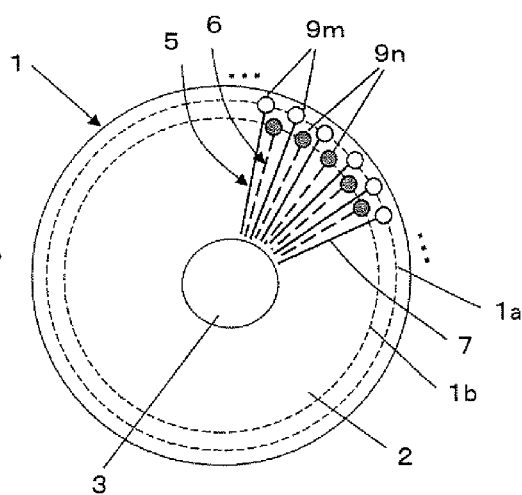
FIG. 18B is a pattern diagram of other modification example of the sixth preferred embodiment.

As shown in FIG. 18A, in case that through-holes 9m and 9n are disposed on one circumference, the number of the lands, disposed on the circumference, of the through-holes depends on the size of each land of the through-hole, thus there is a limitation on the number of the lands to be disposed on the circumference. Consequently, the winding number of the coil is also limited. On the other hand, as shown in FIG. 18B, in the detection coil 1 of the present modification example, each through-hole 9m is disposed evenly on a circumference 1a in the substrate 2, and each through-hole 9n is disposed evenly on a circumference 1b which is concentric with the circumference 1a, and moreover, each through-hole 9m and 9n are disposed closely but not to overlap each other in a zigzag manner. According to this composition, the number of the lands of the through-hole can be increased, and the winding number of the coil can be increased, thus the current detection sensitivity can be improved. Besides, it is preferable to dispose the circumference 1a and 1b in proximity to each other.

Figure 19:
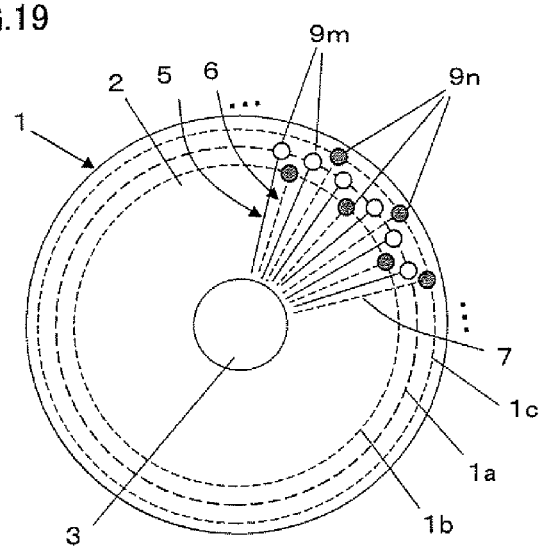
FIG. 19 is a pattern diagram of other modification example of the sixth preferred embodiment.

The other modification example is further shown in FIG. 19. In the present modification example, the through-holes connecting the coils on the front face and the rear face are regularly disposed on three circumferences, which are concentric circles having different radiuses. On the other words, each through-hole 9m is disposed on the outer circumference 1a which is concentric with the opening 3 in the substrate 2, and each through-hole 9n is regularly disposed on the circumference 1b having a smaller circumference than the circumference 1a and on a circumference 1c having a larger circumference than the circumference 1a. Each through-hole 9m and 9n are disposed closely and alternately but not to overlap each other in a zigzag manner. The number of the lands of the through-hole can further be increased by disposing the through-holes 9m and 9n on the triple circumferences. Consequently, the winding number of the coil can be increased, and the current detection sensitivity can be improved.

Figure 20A:
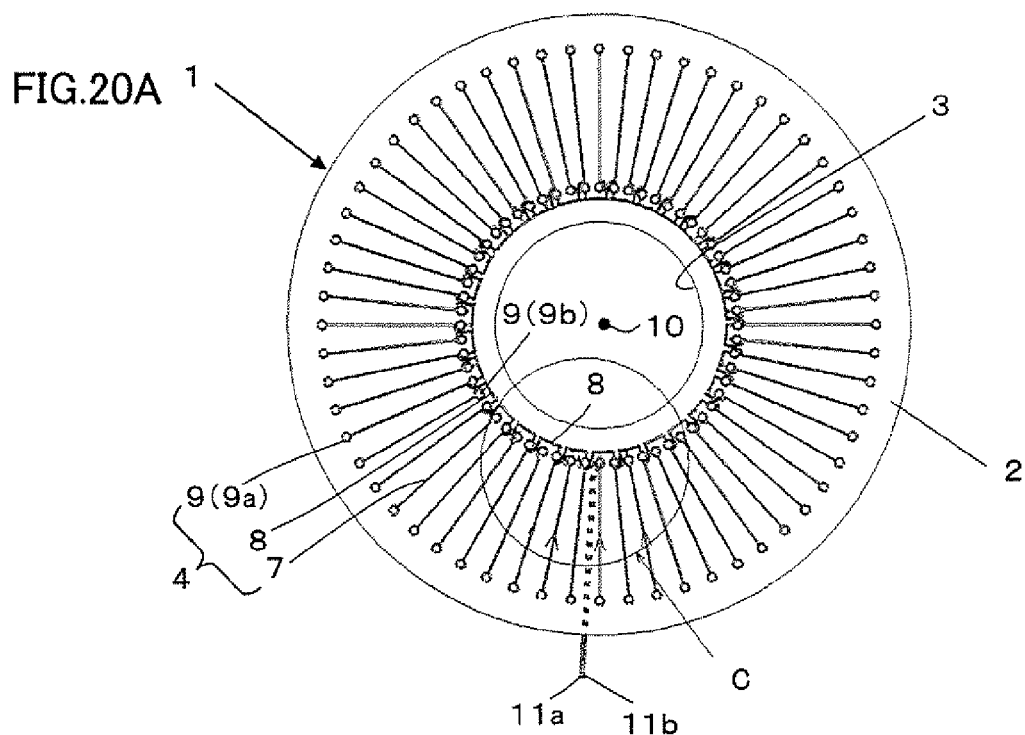
FIG. 20A is a plane view of an alternating current detection coil according to a seventh preferred embodiment of the present invention.
Figure 20B:
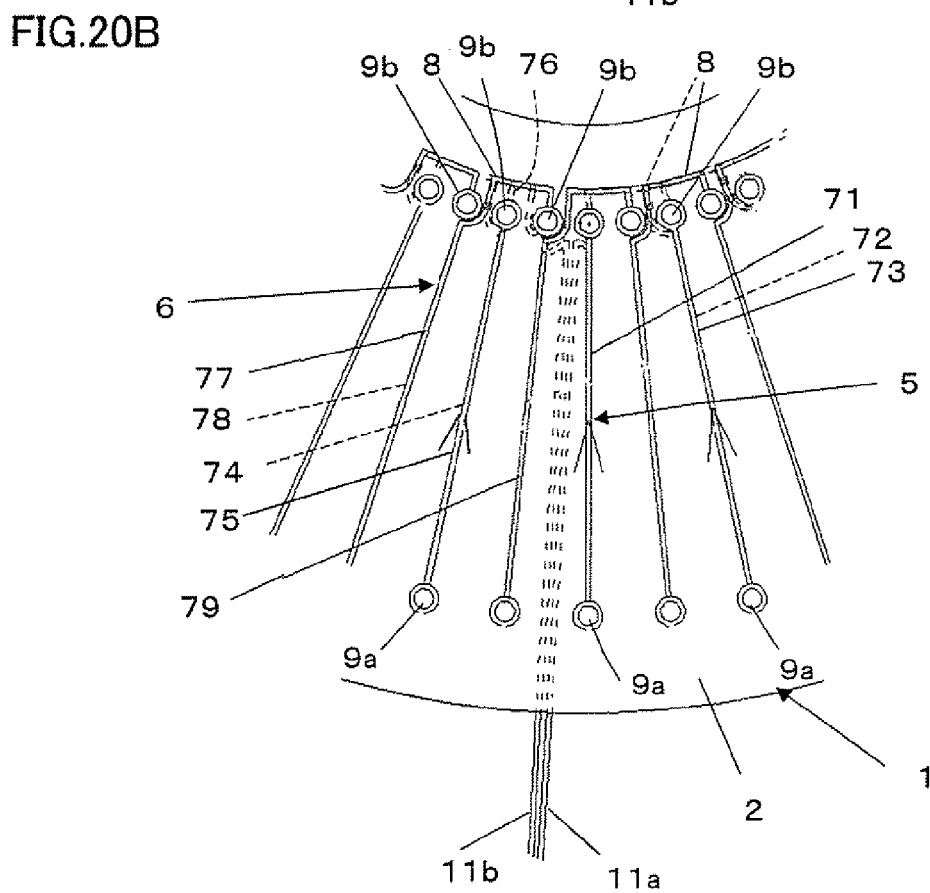
FIG. 20B is a magnified view of a part C in FIG. 20A.

Next, the alternating current detection coil according to the seventh preferred embodiment of the present invention is described with reference to FIGS. 20A and 20B. The detection coil 1 of the present preferred embodiment is different from the preferred embodiment described above in that the radial-line conductors 7 on the front face and the rear face of the substrate 2 are disposed on positions so as to overlap each other at between the front face and the rear face.

The respective coils in the toroidal coil 4 in the detection coil 1 are formed by electrically connecting the respective radial-line conductors 7 and the respective connection parts 8 disposed on the inner side close to the opening 3 through the respective through-holes 9. The radial-line conductors 7 (71 to 79) formed on the front face and the rear face of the substrate 2 are symmetrically formed on positions so as to overlap each other, when seen from the thickness direction of the substrate 2. The connection parts 8 extend in the circumferential direction from the through-holes 9b connected to the ends of the radial-line conductors 7 in the inner side, and are disposed on the inner side at a certain pitch, and then connect electrically the respective plural radial-line conductors 7. The conductors in the toroidal coil 4 are uniformly formed around the center 10 in the opening 3 in the substrate 2 to be approximately symmetrical with respect to the center 10. The radial-line conductors 7 on the rear face overlap the radial-line conductors 7 on the front side and thus, they are not shown in FIGS. 20A and 20B.

According to such a composition, when seeing the forward coil 5 and the backward coil 6 from the axial direction, there is almost no area surrounded by the radial-line conductors 7 on the front face and the rear face in the forward coil 5 and the backward coil 6. Thus, when seeing the coil patterns of the forward coil 5 and the backward coil 6 from the axial direction, the respective areas can be identical and minimum.

Accordingly, it is possible to minimize and cancel out the lead current caused by the external magnetic field. Thus, the negative effect from the external magnetic field can be reduced, and the current detection accuracy can be improved.

Figure 21A:
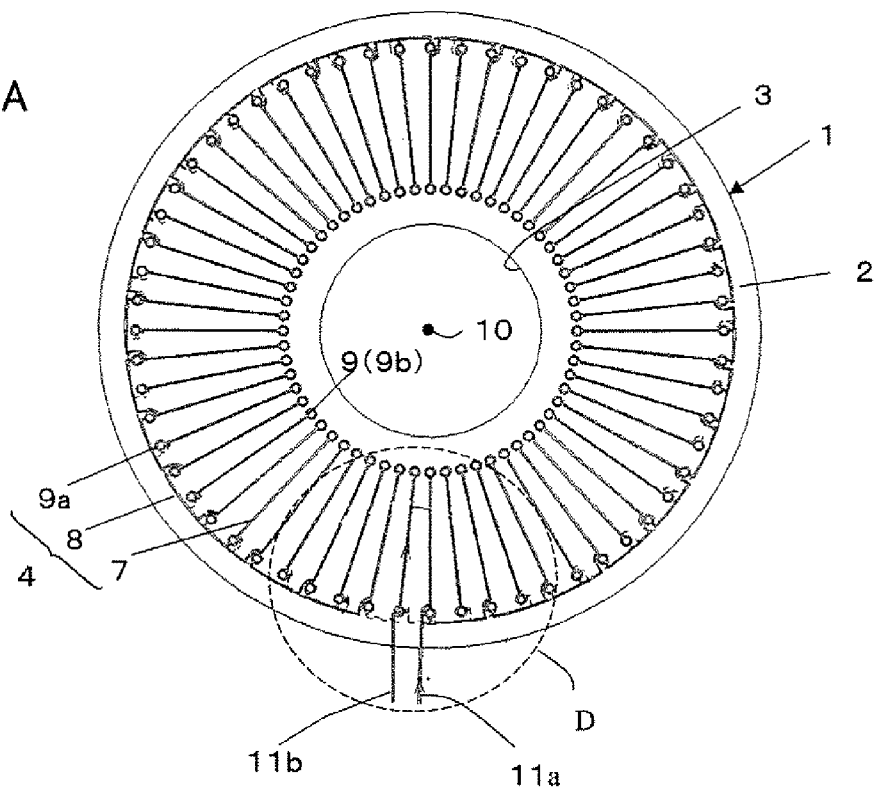
FIG. 21A is a plane view of a modification example of the seventh preferred embodiment.
Figure 21B:
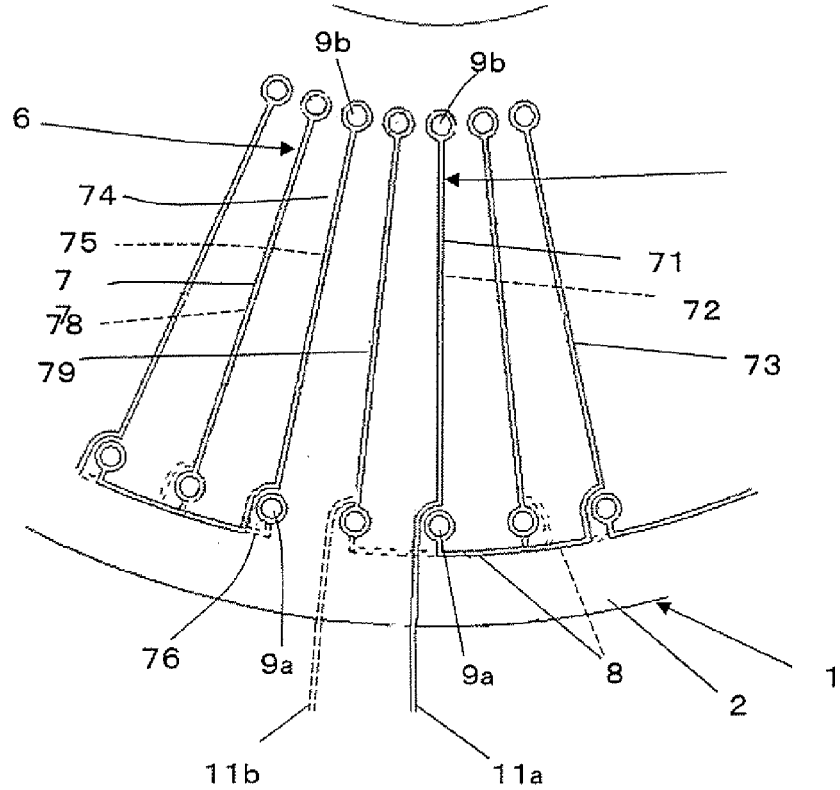
FIG. 21B is a magnified view of a part D in FIG. 21B.

Next, the modification example of the preferred embodiment described above is described with reference to FIGS. 21A and 21B. The present modification example is different from the above description in that the connection parts 8 are disposed on the outer side far from the opening 3 in the substrate 2, and the connection point (the return line) 76 between the forward coil 5 and the backward coil 6 is also disposed on the outer side.

The respective forward coil 5 and the backward coil 6 are formed by connecting electrically connecting the respective radial-line conductors 7 and the respective connection parts 8 disposed on the outer side far from the opening 3 through the respective through-holes 9. The conductors in the forward coil 5 and the backward coil 6 are uniformly formed around the center 10 in the opening 3 in the substrate 2 to be approximately symmetrical with respect to the center 10.

The more connection parts 8 can be disposed by providing them on the outer side in the substrate 2, which has a large disposition area, and the radial-line conductors 7 can be increased. Thus the density of coil and the detection sensitivity can be enhanced.

Figure 22A:
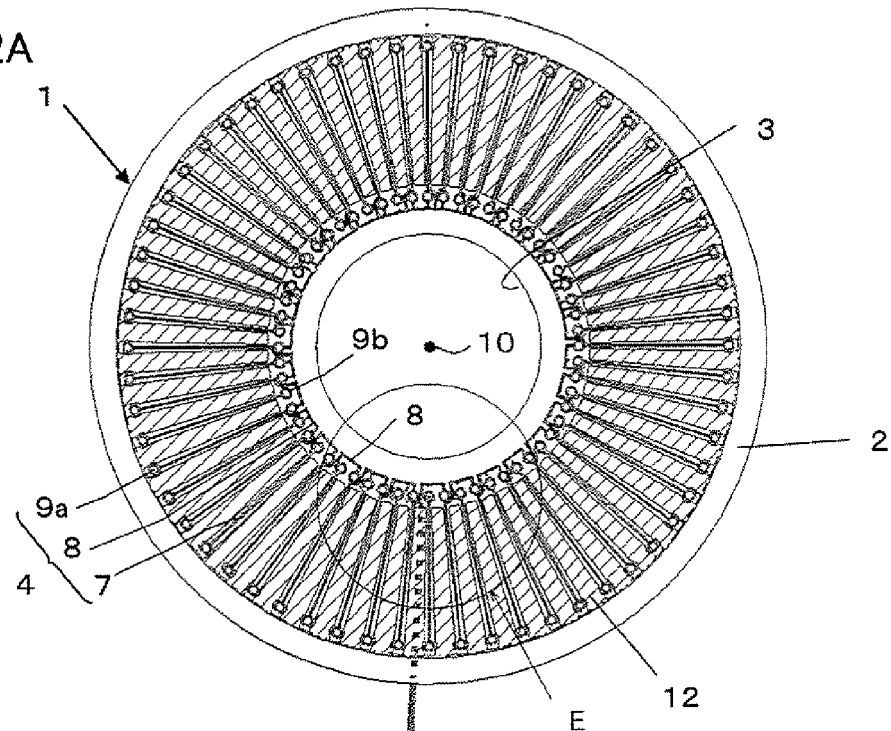
FIG. 22A is a plane view of other modification example of the seventh preferred embodiment.
Figure 22B:
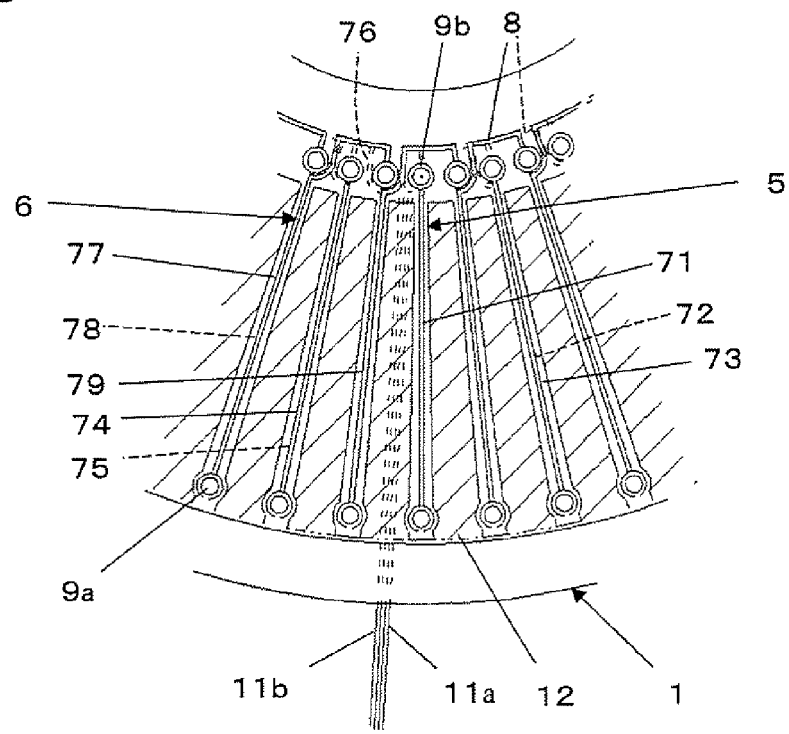
FIG. 22B is a magnified view of a part E in FIG. 22A.

Next, the other additional modification example is described with reference to FIGS. 22A and 22B. In the present modification example, a pattern having electrically the same potential is provided in an open space where the coil pattern is not provided, and this pattern is connected to a reference potential side of a coil output signal.

A metal pattern 12, which has electrically the same potential while maintaining an electrical isolation from the coil pattern, is provided in the open space where the coil pattern formed by the radial-line conductors 7 and the connection parts 8 is not provided on the substrate 2 in the detection coil 1. The metal pattern 12 is provided to have electrically the same potential in the open space where the coil pattern is not provided as wide as possible, in one face or both the front face and the rear face of the substrate 2. This metal pattern 12 is connected to the reference potential side of the coil output signal, that is, a ground potential side, for example.

The negative effect from an electrostatic noise from between the electrical wire, which the current being detected is let into, and the coil can be reduced by providing the metal pattern 12 having the reference potential in the open space in the pattern of the substrate 2 in this manner. This composition can eliminate the need for a shielding process such as covering the coil with a metal shield or covering a coil laminate board with a shielding foil, and the shielding foil as an additional component becomes unnecessary, and thus a cost reduction can be achieved.

Figure 23:
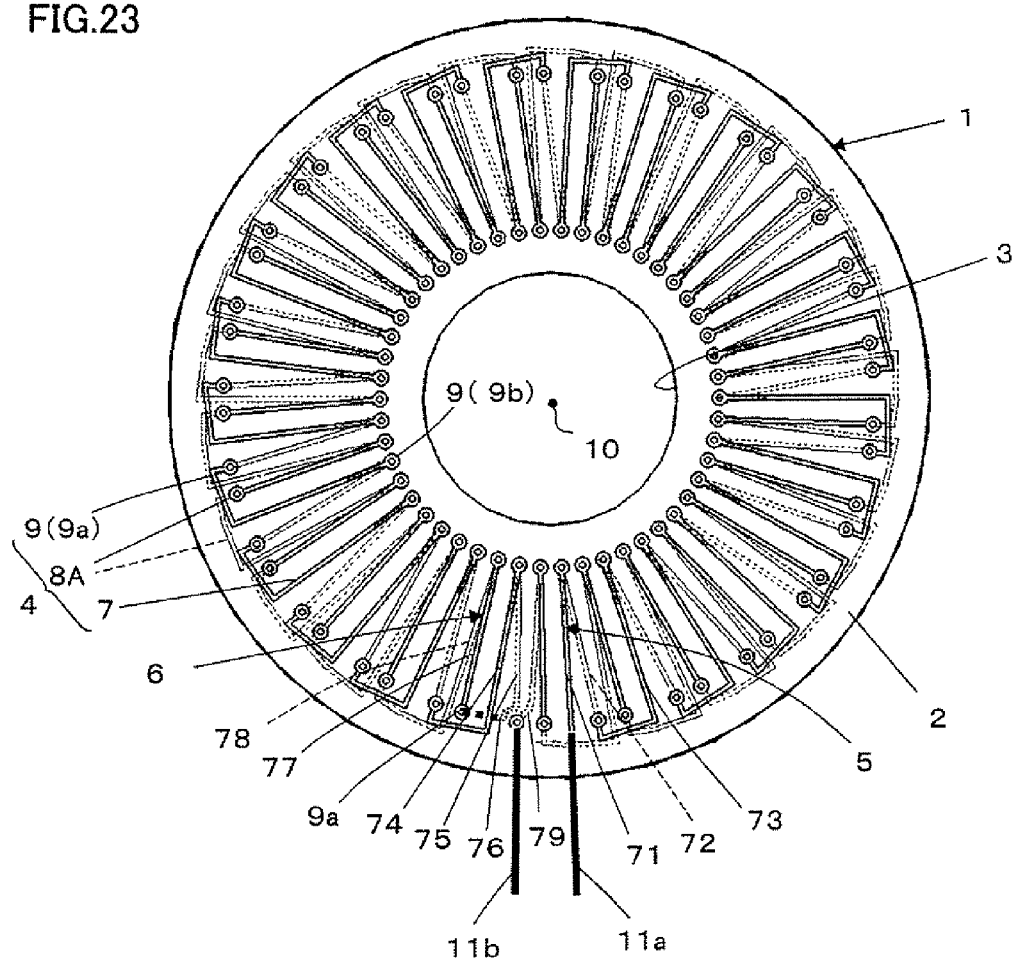
FIG. 23 is a plane view of an alternating current detection coil according to an eighth embodiment of the present invention.

Next, the alternating current detection coil according to the eighth embodiment of the present invention is described with reference to FIG. 23. In the detection coil 1 of the present preferred embodiment, the radial-line conductors 7 and connection parts 8A connecting the respective radial-line conductors 7 in the substrate 2 are linearly formed.

In the detection coil 1, the forward coil 5 and the backward coil 6 are formed by connecting electrically each radial-line conductor 7 and each connection part 8A, which is disposed on the outer side far from the opening 3, through the through-hole 9. Each connection part 8A is routed in a rectangular linear shape to avoid a contact with the next radial-line conductors 7 (71 to 79), and the coil patterns formed by the connection parts 8A and the radial-line conductors 7 are uniformly formed around the center 10 in the opening 3 in the substrate 2 to be approximately symmetrical with respect to the center 10.

As described above, by forming linearly the connection parts 8A, the coil patterns formed by the connection parts 8A and the radial-line conductors 7 are linearly formed except for the land patterns for the through-holes. Thus, the coil patterns on the front face and the rear face of the substrate 2 are composed to have the identical shape with high accuracy. Thus, the areas of the forward coil 5 and the backward coil 6, seen from the axial direction, can be equalized, so that the canceling effect against the negative effect from the external magnetic field is improved, and the current detection can be carried out with high accuracy. Moreover, the coil patterns can be formed in linear shape, so that they can be arranged easily and accurately.

Figure 24:
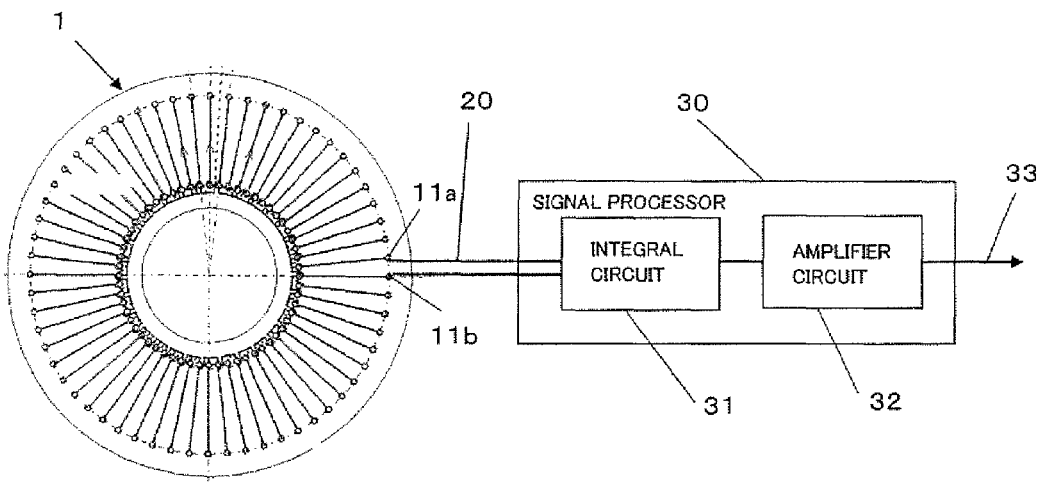
FIG. 24 is a block diagram showing that a current is detected by an alternating current detection coil of the present invention.
Figure 25:
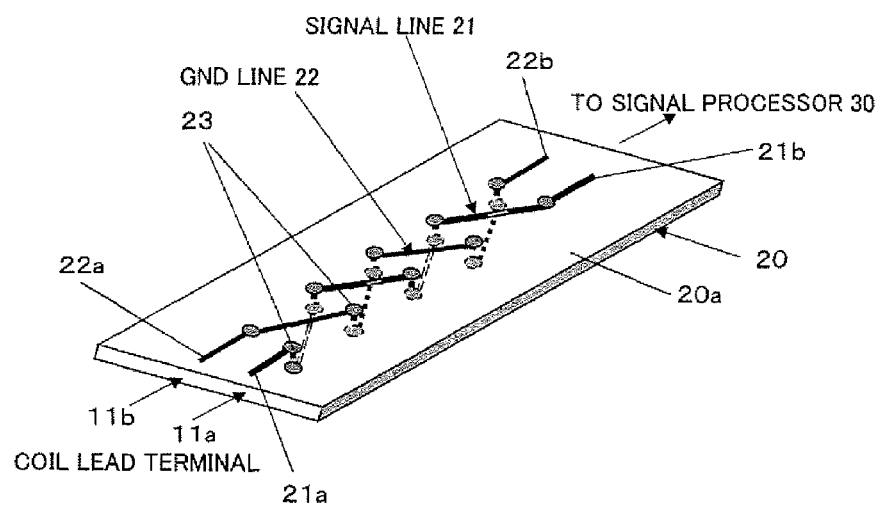
FIG. 25 is a block diagram of a signal output line pattern part of the alternating current detection coil shown in FIG. 24.

Next, a signal output and an embodiment of a signal processor in the alternating current detection coil of the present invention are described with reference to FIGS. 24 to 26. As shown in FIG. 24, the coil lead terminals 11a and 11b in the detection coil 1 are connected to a signal processor 30 through a signal output line pattern part 20. The signal processor 30 comprises an integral circuit 31, which converts an induced voltage having a differential waveform which is output from the coil lead terminals 11a and 11b in the detection coil 1 into a current waveform, and an amplifier circuit 32 which amplifies an output from the integral circuit 31, and a current is measured by an output current 33 from the integral circuit 31. A connection line between the detection coil 1 and an input terminal of the signal processor 30 is generally affected by the external magnetic field, and it may cause a detection error in the coil current detection. Consequently, the signal output line pattern part 20 as shown in FIG. 25 is used for the connection line. The signal output line pattern part 20 has a wiring pattern crossing alternately on both a front face and a rear face of a double-sided print board 20a and thus output wirings have a twist (crossing) structure.

The wiring pattern described above is composed of a signal line 21 and a GND line 22. The signal line 21 and the GND line 22 are consecutively connected to each other through through-holes 23, respectively, with crossing each other several times on the front face and the rear face of the double-sided print board 20a. In this manner, a patterning is carried out on the signal line 21 and the GND line 22 so that they cross each other alternately on the front face and the rear face with using the through-holes 23, and thus they have a twist structure. The signal line 21 on the front face and the rear face of the print board 20a is indicated in fill line and broken line, and the GND line 22 on the front face and the rear face is indicated in heavy full line and heavy broken line, A signal input terminal 21a and a ground input terminal 22a are connected to the coil lead terminals 11a and 11b, respectively, and a signal output terminal 21b and a ground output terminal 22b are connected to the signal processor 30 in a next stage.

The two output lines, that is the signal line 21 and the GND line 22, have the twist structure as described above, thus even when receiving an external magnetism, the negative effect from the external magnetism can be canceled between the signal line 21 and the GND line 22. Consequently, the negative effect from the external magnetic field on the connection line between the coil lead terminals 11a and 11b and the signal processor 30 can be reduced, and then the current detection error can be reduced. Additionally, if the number of twist increases, the negative effect from the external magnetic field can be moreover reduced. Moreover, when the detection coil 1, which has the signal output line pattern part 20, and the signal processor 30 are unified on one print board, a compact sensor coil of small size can be achieved.

Figure 26:
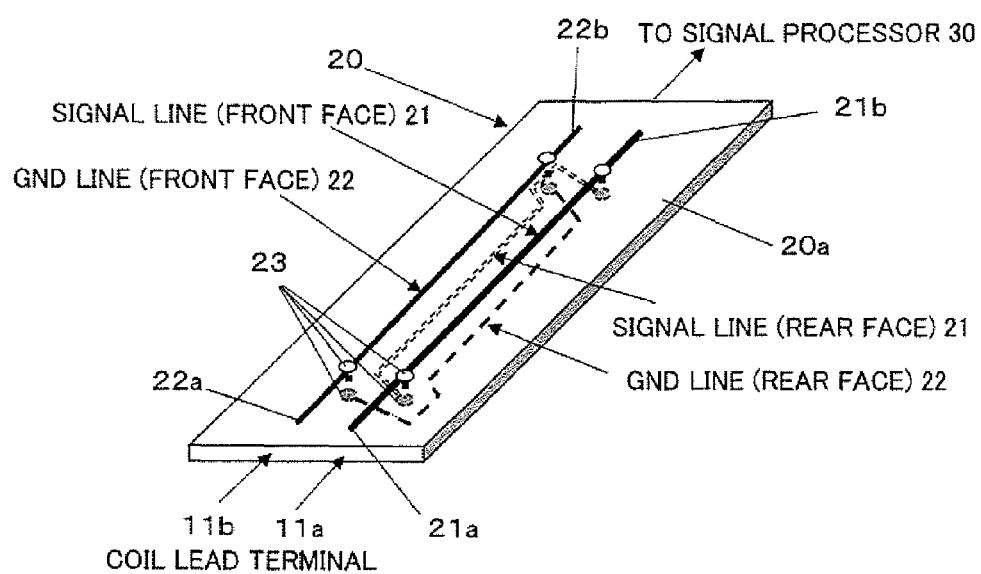
FIG. 26 is a block diagram of other modification example of the signal output line pattern part shown in FIG. 25.
Figure 27:
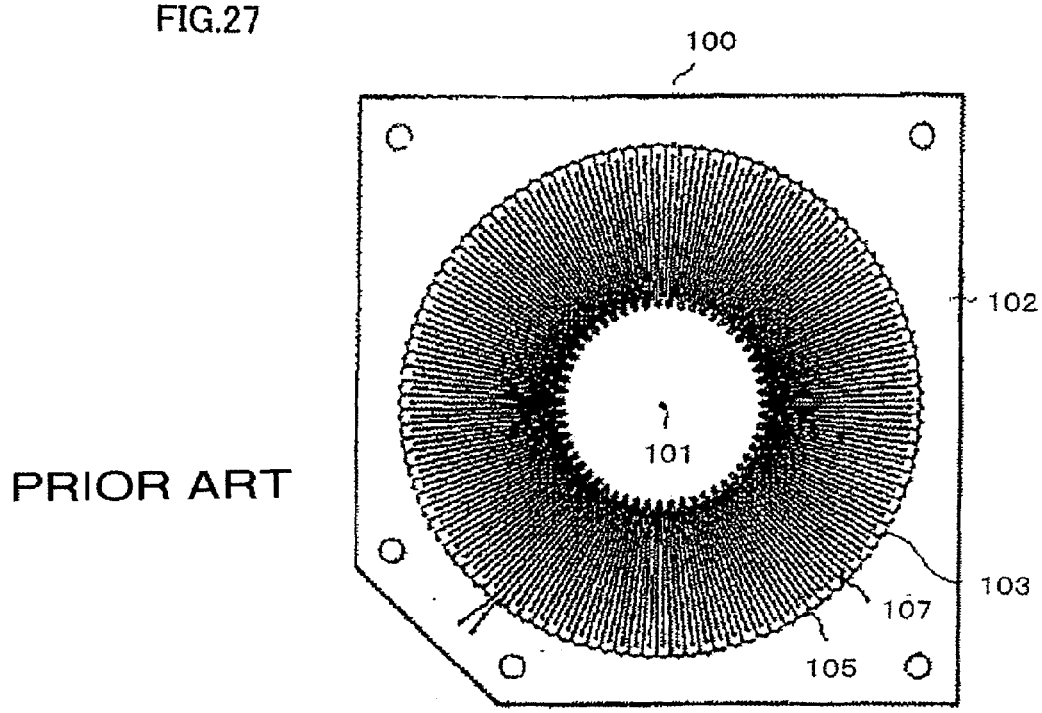
FIG. 27 is a front view of a conventional alternating current detection coil.
Figure 28:
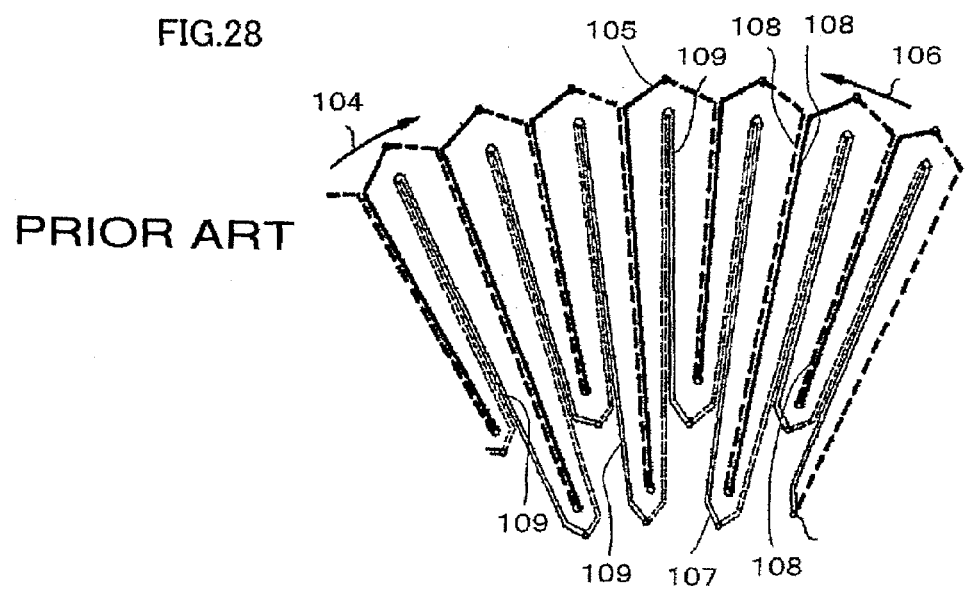
FIG. 28 is a partial magnified view of the alternating current detection coil shown in FIG. 27.

Next, the other example of the signal output line pattern part 20 is shown in FIG. 26. In the signal output line pattern part 20, the signal line 21 and the GND line 22 overlap each other in both the front face and the rear face, when seen from a thickness direction of the print board 20a.

In other words, a patterning is carried out on the signal line 21 and the GND line 22 so that the GND line 22 is disposed on the rear face of the signal line 21 on the front face, the signal line 21 is disposed on the rear face of the GND line 22 on the front face, and they overlap each other on the both front face and rear face. The respective wiring patterns on the both front face and the rear face described above are connected through the through-holes. The signal lines 21 on the front face and the rear face of the print board 20a is indicated in full line and broken line, and the GND lines 22 on the front face and the rear face is indicated in heavy full line and heavy broken line.

By using the signal output line pattern part 20 having such a composition, an induced electromotive force, which is generated between the signal line 21 and the GND line 22 patterned on the front face, and an induced electromotive force, which is generated between the signal line 21 and the GND line 22 on the rear face, caused by magnetic fields from any direction are canceled by each other, so that a magnetical influence can be suppressed. Thus, the negative effect from the external magnetic field on the connection line between the coil lead terminals 11a and 11b and the signal processor 30 can be reduced. Moreover, the number of the through-holes can be reduced, so that the negative effect from the external magnetic field can be removed by minimizing the number of the through-holes.

The present invention is not limited to the compositions of the preferred embodiments described above, however, various modification are applicable. For example, in the various preferred embodiments described above, the coil is formed with using the print board, however, any component, which is not the print board, is applicable if it forms the coil.

Moreover, the present application is based on Japanese Patent Application No. 2005-348941, and contents of the patent application are incorporated into the present application in reference form.

What is claimed is:

1. An alternating current detection coil for carrying out a non-contact detection of an alternating current, wherein
the alternating current detection coil, which is a toroidal coil, comprising:
plural radial-line conductors which are formed on a front face and a rear face of an insulating substrate so as to radiate out from a periphery of an opening provided on the insulating substrate;
conductive connection parts and conductive first through-holes which extend in a circumferential direction to connect electrically each end of radial-line conductors on the front face and the rear face respectively on either one of an outer side or an inner side of the radial-line conductors; and conductive second through-holes which connect electrically each end of radial-line conductors on the front face and the rear face respectively on other one of the outer side and the inner side of the radial-line conductors, wherein plural winding turns are consecutively formed by a connection of each radial-line conductor on the front face and the rear face respectively through the conductive connection parts and the first and the second through-holes, the plural winding turns comprise a forward coil which winds in one direction and a backward coil which winds in a reverse direction with returning consecutively from an end of the forward coil, each winding turn of the forward coil and the backward coil is disposed alternately on both the front face and the rear face, each conductive connection part is routed to avoid a contact with a next radial-line conductor on both the front face and the rear face, and each shape of the radial-line conductors in the forward coil and the backward coil and the conductive connection parts on the front face and the rear face are identical with each other.

2. The alternating current detection coil according to claim 1, wherein each conductive connection part has a pattern to connect each end of the radial-line conductors on a front face and a rear face through the first through-hole, and the patterns on the front face and the rear face have a length approximately equal to each other with the through-hole between.

3. The alternating current detection coil according to claim 1, wherein each pitch per one turn of the forward coil and the backward coil is formed equally to each other.

4. The alternating current detection coil according to claim 1, wherein the first and the second through-holes are disposed on an circumference at regular intervals, centering around a substantial center of the opening.

5. The alternating current detection coil according to claim 1, wherein the conductive connection parts are provided on the outer side of the radial-line conductors.

6. The alternating current detection coil according to claim 1, wherein land patterns, each of which has a size equal to a land of the first through-hole, are provided on positions, where each radial-line conductor in the forward coil and the each conductive connection part are connected, and where the through-holes are not formed.

7. The alternating current detection coil according to claim 1, wherein two radial-line conductors adjacent to each other on the front face and the rear face are provided so that a line segment, which bisects an angle between the two radial-line conductors, tangents to a circle of which center is concentric with a toroidal coil.

8. The alternating current detection coil according to claim 1, wherein a small-size coil to absorb a non-uniformity between the forward coil and the backward coil is provided on at least one of lead lines, which extend from respective lead terminals in the forward coil and the backward coil.

9. The alternating current detection coil according to claim 1, wherein the respective radial-line conductors on the front face and the rear face are provided on a position overlapping each other with a plain view.

10. The alternating current detection coil according to claim 1, wherein the respective radial-line conductors in the forward coil and the backward coil adjacent to each other are disposed at closely, on the front face and the rear face, respectively.

* * * * *